(12) United States Patent
Bunin

(10) Patent No.: US 7,289,053 B2
(45) Date of Patent: Oct. 30, 2007

(54) DATA CONVERSION METHODS AND SYSTEMS

(75) Inventor: Haim Bunin, Haifa (IL)

(73) Assignee: Speedark Ltd., Haifa (IL)

( * ) Notice: Subject to any disclaimer, the term of this patent is extended or adjusted under 35 U.S.C. 154(b) by 0 days.

(21) Appl. No.: 10/552,033

(22) PCT Filed: Aug. 18, 2004

(86) PCT No.: PCT/IL2004/000757

§ 371 (c)(1),
(2), (4) Date: Jun. 12, 2006

(87) PCT Pub. No.: WO2005/017643

PCT Pub. Date: Feb. 24, 2005

(65) Prior Publication Data

US 2006/0267812 A1    Nov. 30, 2006

Related U.S. Application Data

(60) Provisional application No. 60/496,326, filed on Aug. 18, 2003.

(51) Int. Cl.
*H03M 1/12* (2006.01)

(52) U.S. Cl. .................................. 341/156; 341/155

(58) Field of Classification Search ............. 341/156, 341/155; 600/323; 375/222; 455/561; 381/222
See application file for complete search history.

(56) References Cited

U.S. PATENT DOCUMENTS

| | | | | |
|---|---|---|---|---|
| 6,157,850 | A * | 12/2000 | Diab et al. | 600/323 |
| 6,353,629 | B1 * | 3/2002 | Pal | 375/222 |
| 6,363,262 | B1 * | 3/2002 | McNicol | 455/561 |
| 2003/0091207 | A1 * | 5/2003 | Killion et al. | 381/321 |

* cited by examiner

*Primary Examiner*—Jean Bruner Jeanglaude
(74) *Attorney, Agent, or Firm*—Mark M. Friedman

(57) ABSTRACT

Methods and systems for implementing high-performance data converters remove analog technology bottlenecks and provide higher converter resolution and higher speed using lower-performance converters and processing in the frequency domain. The method comprises transforming a time domain input signal into a frequency domain signal in a digital form, processing the frequency domain signal and the input signal using at least two lower-performance data converters in order to obtain at least two processed signals, and recombining the at least two processed signals to obtain a final output signal from the high-performance converter. The processing may include dividing the frequency domain into at least two frequency domain parts, one related to a low-resolution signal to noise ratio (SNR) and the other related to a high-resolution SNR, and using frequency information resulting from the division to obtain the at least two processed signals.

42 Claims, 13 Drawing Sheets

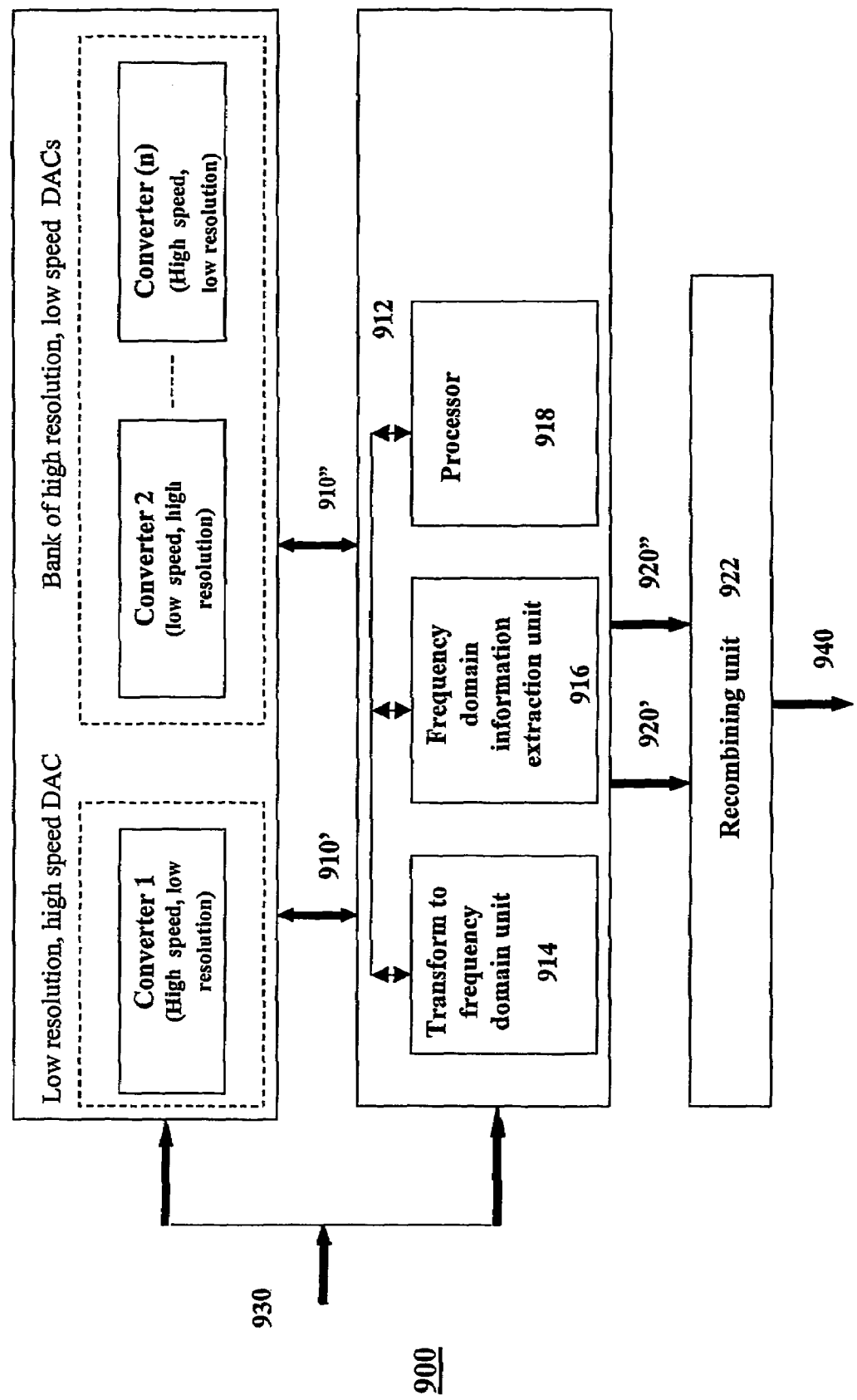
FIG. 9-B

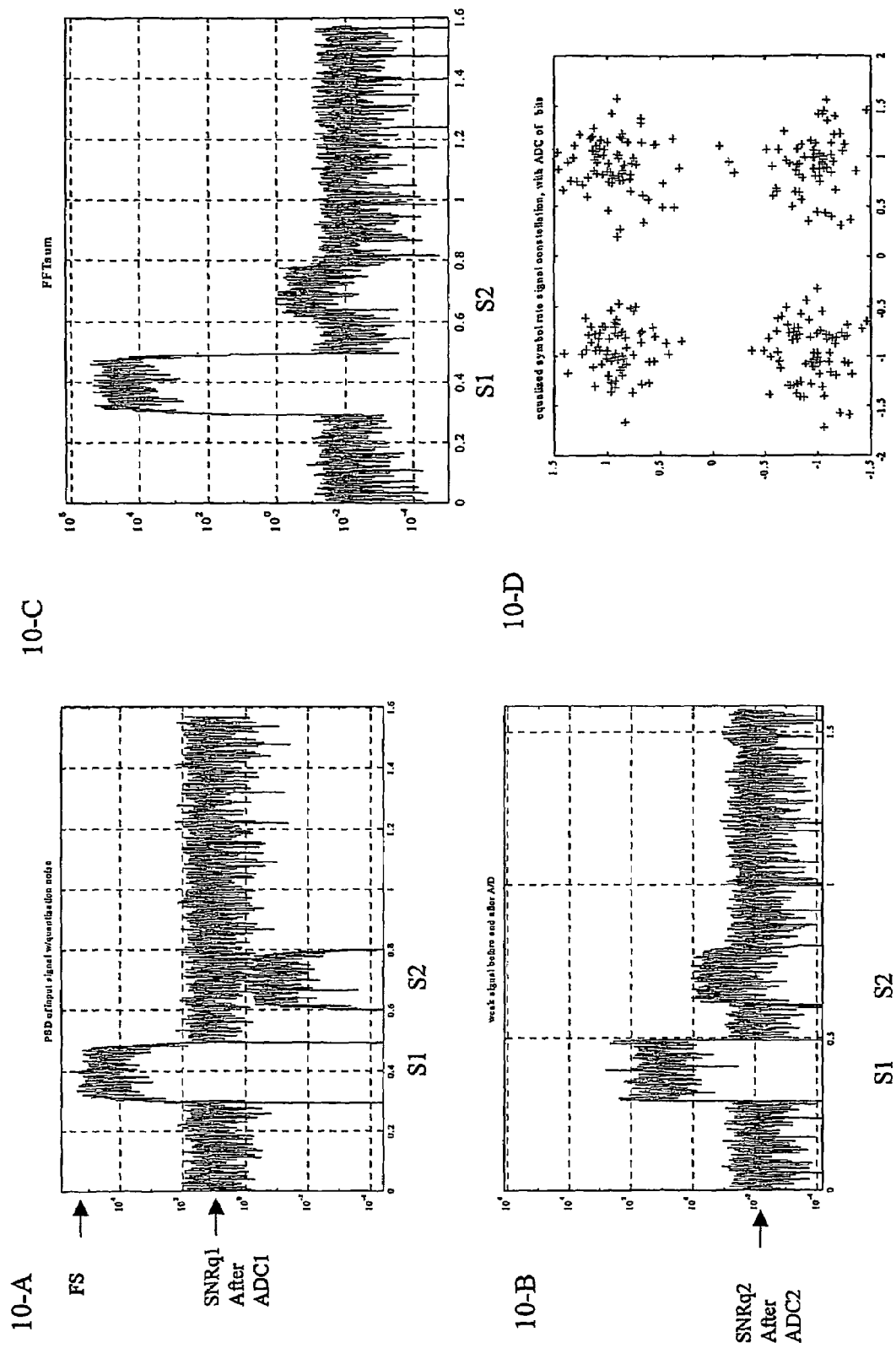
Fig 10 (A-D)

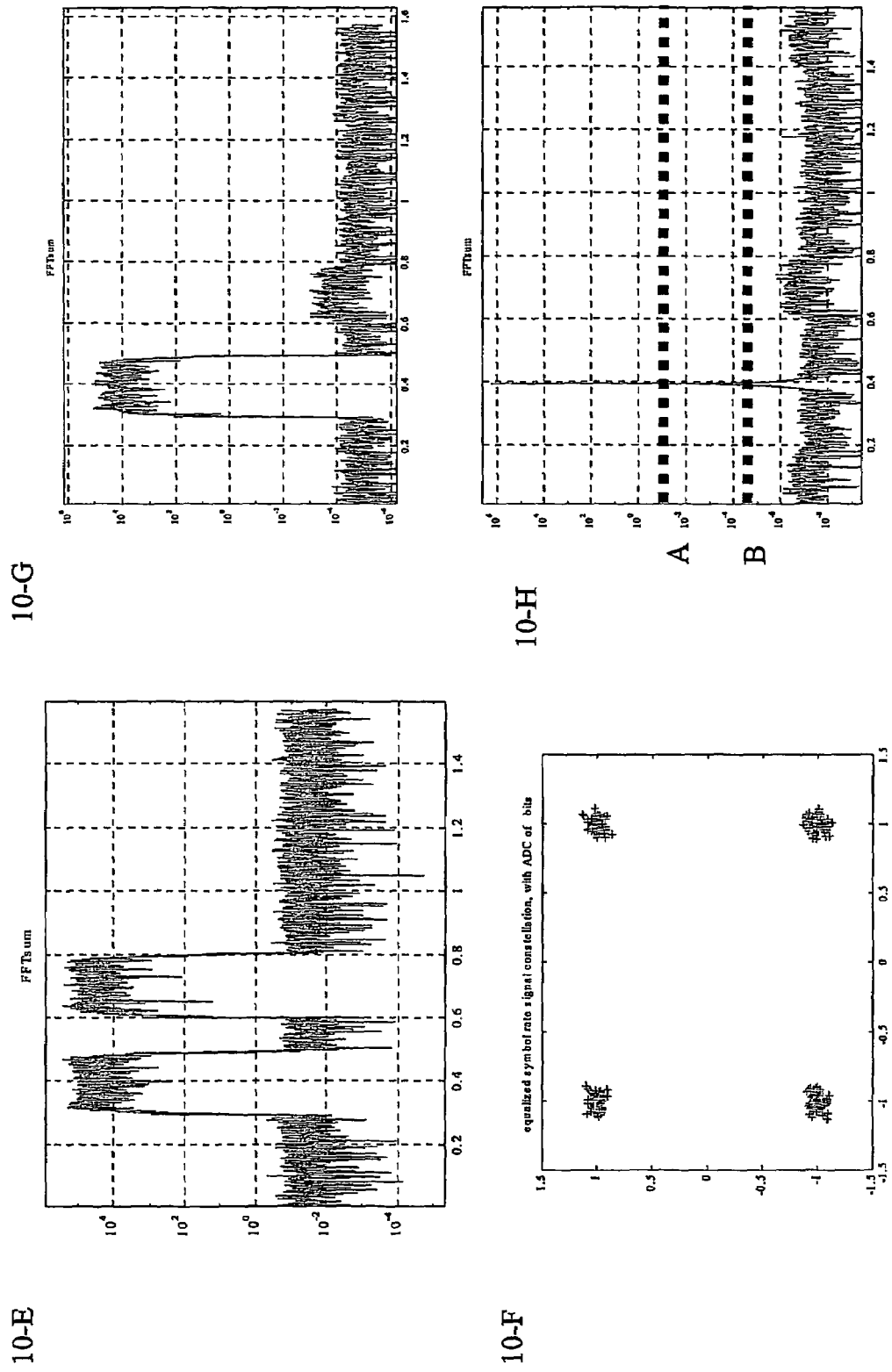
Fig 10 (E-H)

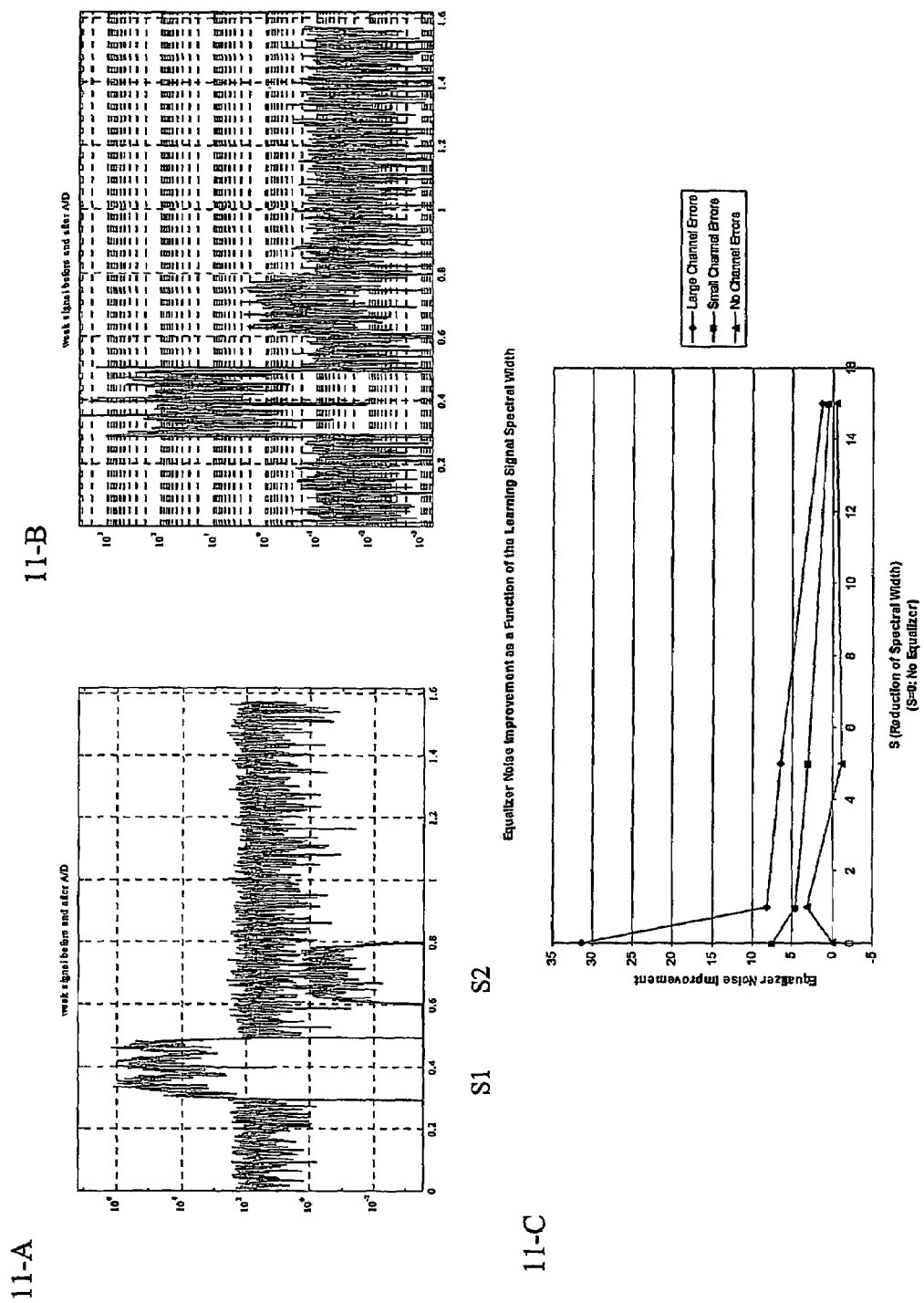
Fig 11 (A-C)

DATA CONVERSION METHODS AND SYSTEMS

CONTINUING DATA

This application is a 371 of PCT/IL04/00767 filed on Aug. 18, 2004, which claims benefit of U.S. Provisional Application 60/496,326 filed Aug. 18, 2003.

FIELD OF THE INVENTION

The present invention relates to signal processing, particularly to data conversion methods and systems, and more particularly to analog-to-digital conversion and digital-to-analog conversion of signals.

BACKGROUND OF THE INVENTION

Data conversion is a critical technology in many applications. Analog-to-digital converter (ADC) technology is progressing much slower (~1.5 Bits in 9 years, see e.g. R. H. Walden, "Performance trend for analog-to-digital converters," IEEE Comm. Magazine, February 1999 pp. 96-101) than digital signal processing (DSP) technology (which follows Moore's law). The main reasons for the slow advance are the bottlenecks of high-resolution/high-speed analog circuits. Many commercial analog-to-digital converters (ADCs) today use a Pipeline/Subranging (P/S) architecture (see FIG. 1) to combine two or more low-resolution, high-speed ADCs in order to achieve high-resolution while maintaining wideband operation.

Analog-to-digital conversion is a critical technology in many fields (communications, measurements, military/defence, medical equipment, etc.). Among others, it enables use of the advanced digital and computer technology in digital processing of signals. One example is SDR (Software Defined Radio) base station (BS) applications, were the analog-to-digital conversion is one of the enabling technologies. One identified analog-to-digital conversion bottleneck represents the difference between the required and achievable number of ADC bits for multicarrier/multi-standard BS. About 17 bits are needed, while the state of the art ADC commercial technology, (usually a P/S architecture) is only 14 bit (about 12 effective bits). In addition, ADCs are important for the new generations of Mobile/Handset, Asynchronized Digital Subscriber Line (ADSL) receivers (where 14 effective bits are required to reduce the distance limitation of ADSL) and other home and consumer applications. The fastest ADC architecture is the Flash architecture, but its resolution is limited to about 8 bits by the number of comparators used. Full Flash requires 256 comparators for 8 bit resolutions.

A popular prior art high-speed and high-resolution ADC architecture is the P/S architecture 100 shown in FIG. 1. Typically, an architecture 100 comprises an input sample and hold (S/H) circuit 102, a first stage 104, a digital correction and time alignment block 106, optional S/P additional stages 108 and a final low-resolution ADC 110, interconnected as shown. A typical stage 104 includes a low-resolution ADC 112, a high accuracy digital-to-analog converter (DAC) 114, a subtractor 116, and an optional second S/H unit 118, interconnected as shown.

In use, the voltage of an incoming time domain analog signal 111 is first sampled with S/H circuit 102 which must have the final accuracy of the converter, and then measured with low-resolution ADC 112. The voltage of the measured digital signal is reconstructed in the time domain with high DAC 114 into a reconstructed output voltage 128, which is input to subtractor 116. Subtractor 116 subtracts output voltage 128 from a low-resolution replica 130 of the sampled input voltage that goes through second, optional S/H 118, and creates an error voltage 132. Error voltage 132 is then amplified in a Gain unit 120 and measured with final low-resolution ADC 110. The process can be repeated with optional additional S/P stages 108 inserted between the "final" ADC and the first ADC stage.

The level of the error voltage is amplified to a required level at an output 140 of any additional or final ADC. Extra bits of low-resolution ADCs from all stages are used for digital correction using block 106.

A main disadvantage of this architecture is that it requires an accurate analog path that includes S/H units, subtractors and amplifiers. AU these components have to settle to the final accuracy of the voltage within the short sampling pulse period of the entire system. This requirement is a serious "analog" bottleneck in terms of both accuracy and maximum speed of the converter.

Other ADC architectures such as Folding/Interpolating are also used at higher sampling rates, but they do not provide the resolution of the S/P architectures. Use of parallel converters (time or frequency interleaving methods) increases the sampling rate, but comes at a cost of a linear increase in the number of converters in parallel. Moreover, in addition to increased cost and matching difficulties, these architectures do not improve the basic converter resolution and/or dynamic range (DR).

When a proper linear ADC with enough resolution/DR is not available (for a given sampling speed/bandwidth) or is beyond the state of the art, DR reduction techniques are sometimes proposed in order to reduce the DR of the strong signals (usually interfering signals) at the input to the lower resolution ADC to avoid saturation of the ADC. Examples are given in K. Huang, Q. S. Quek, S. N. A. Ahmed, B. Jin, and M. A. Kumar, "Techniques for reducing dynamic-range requirements for a software radio receiver", *Proceedings of Software Defined Radio Technical Conference* 2002, November 2002; and K. Huang and Q. S. Quek, "Method for Dynamic Range Reduction in Wideband Receiver", PCT/SG02/00196 filed 28, Aug. 2002, and references therein, specifically U.S. Pat. Nos. 6,195,537, 5,694,395 and 5,826,181.

In Huang's paper and patent applications, the wideband input signal from the receiver is split into two (first and second) signals with respective paths. The second signal is digitized and the filter of the communication channel frequency (which is assumed known) is used to suppress the desired signal in the second signal path. The resulting signal is used to suppress the strong interferers by subtracting them from the first signal.

The main disadvantage in Huang's method is that it operates only in a known communication channel and results in a relatively small improvement, which is also strongly dependent on the strong interferers characteristics. The main disadvantage of all prior art DR reduction methods and systems is that they do not provide linear analog to digital conversion over the entire input DR. Most of these methods and systems are also limited to specific applications.

There is therefore a widely recognized need for, and it would be highly advantageous to have, data converter methods and systems (or architectures) that do not require accurate analog circuits such as S/H, precision amplifiers and subtractors, yet provide higher final output resolution and conversion speed than existing state of the art methods and systems.

It would be also advantageous to have ADCs with an optional digital output in the frequency domain, which can be used for digital filtering, channelization, and spectrum analysis applications in areas such as communication, measurement and test equipment, medical equipment and military/defense systems.

SUMMARY OF THE INVENTION

The present invention discloses in various embodiments a new data conversion method and architecture (apparatus) with applications in high-speed, high-resolution analog-to-digital conversion as well as in digital-to-analog conversion.

The resolution of converter technology is reduced with increased sampling speed, see Walden above. The final output resolution mentioned above is about 4-24 bits depending on sampling speed. For example, the state of the art for "high-resolution" ADC in 2003 was about 14 bit at a few hundred Mega samples per second (Msps) and about 10 bit at 1 Giga samples per second (Gsps).

In the context of this invention, "high-resolution" is typically the final resolution at the output of a converter disclosed herein, while "low-resolution" is typically a resolution lower than the final high-resolution of an embodiment of a converter of the present invention by at least one bit, and preferably by between 1-20 bits. Typically, the state of the art DAC technology has a few more resolution bits than the comparable ADC technology, since in most cases it is a simpler technology. For example, DAC technology had in 2003 a high-resolution of 14 bits at 1 Gsps.

"High-speed" is defined typically as a sampling speed above 1 Msps. "Low-speed" typically means a sampling speed lower by 2-250 times than the final high-speed of an embodiment of a converter of the present invention. For narrow-band interferers (such as GSM) the use of our methods provides an even greater resolution improvement. Alternatively, these methods allow use of significantly fewer converters than prior art methods, e.g. parallel/interleaving methods.

The architecture disclosed is essentially that of a wide-band Nyquist converter (but can also be used for oversampling data converters). Advantageously, the method uses frequency domain processing (termed "spectral" processing herein) of an incoming signal. The architecture is general and can be applied to other than S/P arrangements, for example in the improvement of a DAC in FIG. 6 by using frequency domain information in an interleaving arrangement. Further advantageously, most of the conversion functions are performed digitally, thereby solving many of the analog bottlenecks of current state of the art converters. In ADC applications, this results in both a highly improved speed and a highly improved resolution of an ADC. The spectral concept introduced herein can also be used for digital-to-analog conversion with similar advantages. The description continues with emphasis on ADCs, with the understanding that the principles disclosed apply equally well to DACs. As mentioned, an example of the improvement of a DAC performance using the spectral information is shown with reference to FIG. 6.

According to the present invention there is provided a high-performance apparatus for data conversion, comprising: a conversion unit that includes at least two lower-performance converters, each having at least one lower performance parameter than the high-performance apparatus, the conversion unit operative to convert an input signal obtained in the time domain to the frequency domain; a processing unit coupled to the conversion unit and operative to process frequency domain information extracted from the input signal, and, based on the processed frequency domain information, operative to provide in combination with the conversion unit at least two processed signals; and a recombining unit operative to combine the at least two processed signals into a single high-performance output signal.

According to one feature in the high-performance apparatus for data conversion of the present invention, the processing unit includes a transform unit operative to perform a transform from the time domain to the frequency domain on the input signal to provide a frequency domain input signal; a frequency domain information extraction unit operative to perform the extraction through a division of the frequency domain into at least two frequency domain parts, one part related to a low-resolution signal to noise ratio (SNR) and the other part related to a high-resolution SNR; and a processor operative to process the frequency domain information.

According to the present invention there is provided a high-resolution, high-speed apparatus for data conversion, comprising: a first, low-resolution analog-to-digital converter (ADC1) operative to output a first digital output signal in a time domain; a first spectral signal processor operative to use a frequency domain to both convert the first digital output signal into an output analog subtraction signal and to provide a processed digital signal; a second low-resolution analog-to-digital converter (ADC2) operative to convert an analog error signal formed in a subtraction operation involving the output analog subtraction signal into a second digital output signal; and a digital combining unit operative to receive the processed digital signal and the second digital output signal and to combine both signals into a final digital output signal; whereby the apparatus has a higher resolution that either ADC1 or ADC1, and whereby the data conversion is performed in the frequency domain using frequency domain/spectral tools, thereby providing an improved dynamic range and quantization noise, a reduction or elimination of critical analog circuit requirements and bottlenecks, and an increase of the sampling rate relative to existing P/S architectures.

According to the present invention there is provided a method for implementing a high-performance converter comprising the steps of: processing a frequency domain signal and a time domain input signal using at least two data converters having each at least one lower performance parameter than the high-performance converter in order to obtain at least two processed signals, wherein the processing includes transforming the time domain input signal into the frequency domain signal in a digital form; dividing the frequency domain into at least two frequency domain parts, one part related to a low-resolution SNR, and another part related to a high-resolution SNR thereby extracting frequency domain information from the frequency domain signal in a digital form, and using it to obtain the at least two processed signals; and recombining the at least two processed signals to obtain a first final output signal from the high-performance converter, whereby the method provides higher performance and other advantages than comparable data conversion methods that work in the time domain According to the present invention there is provided a method for implementing a high-performance analog-to-digital converter comprising the steps of: providing a first low-resolution analog-to-digital converter (ADC1) operative to convert an analog input signal into a first digital output signal in a time domain; providing a first spectral signal processor operative to process the first digital output signal and other received digital signals in a frequency domain and to provide a processed digital signal; providing a second low-resolution analog-to-digital converter (ADC2) operative to convert an analog error signal formed in a subtraction operation involving the output analog subtraction signal into a second digital output signal; and providing a digital combining unit operative to receive the processed digital signal and the second digital output signal and to combine both signals into a final digital output signal; whereby the analog-to-digital data conversion is performed preferably at least in part in the frequency domain using spectral tools, thereby providing an improved dynamic range and quantization noise, a reduction or elimination of critical analog circuit requirements and bottlenecks, and an increase of the sampling rate relative to existing P/S architectures.

The major components of the data converters disclosed herein are digital (with highly relaxed requirements for the remaining analog parts). Such data converters are expected to enjoy faster progress and better scaling of the digital technology in terms of performance, cost, power consumption, etc., in comparison with the existing analog technology.

As mentioned, the ADC architecture introduced herein shifts many of the analog circuit requirements to the digital part of a converter. The main advantageous features of the methods and systems disclosed herein include:

a) Improvement of the DR/quantization noise in comparison prior art S/P architectures and other data conversion architectures.

b) Reduction or elimination of critical analog circuit requirements and bottlenecks.

c) Increase of the sampling rate.

d) Unique provision of an optional frequency domain digital output (in addition to the conventional time domain output provided by prior art ADCs). This feature may be very useful in communication and military/defense applications (for channelization and filtering), measurement equipment, and medical and other applications (for real time spectral analysis and frequency domain analysis).

e) A Nyquist bandwidth without the bandwidth limitations of architectures such as Sigma-Delta converters.

These unique features of the methods and systems disclosed herein can be used advantageously to improve the state-of-the-art converter performance, as well as be used in the consumer converter market.

BRIEF DESCRIPTION OF THE DRAWINGS

Reference will be made in detail to preferred embodiments of the invention, examples of which may be illustrated in the accompanying figures. The figures are intended to be illustrative, not limiting. Although the invention is generally described in the context of these preferred embodiments, it should be understood that it is not intended to limit the spirit and scope of the invention to these particular embodiments. The structure, operation, and advantages of the present preferred embodiment of the invention will become further apparent upon consideration of the following description, taken in conjunction with the accompanying figures, wherein:

FIG. 9b shows a general data converter architecture as in FIG. 9, but with a frequency interleaving arrangement of parallel DACs that yield a high-performance DAC;

FIG. 10 shows simulation results using a preferred architecture and method of the present invention;

FIG. 11 shows further simulation results using a preferred architecture and method of the present invention, including calibration/equalization.

DETAILED DESCRIPTION OF THE PREFERRED EMBODIMENTS

The present invention discloses new data conversion architectures and methods, with applications to high-speed, high-resolution ADCs and DACs. In this description, "system", "apparatus" and "data conversion architecture" are used interchangeably. Also in the context of the present invention, the term "performance" represents the two basic data converter parameters: resolution and speed. "High-performance" means high-resolution and high. "Low performance" means low-resolution or low-speed or both. Typical exemplary ranges for "high" and "low" are given below.

In contrast with time domain concepts that serve most prior art data converter architectures, the data conversion architectures and methods disclosed herein use frequency domain tools to extract frequency domain information from the signal. This information is advantageously used in the processing of the signal, which is mainly digital.

Figure 1:
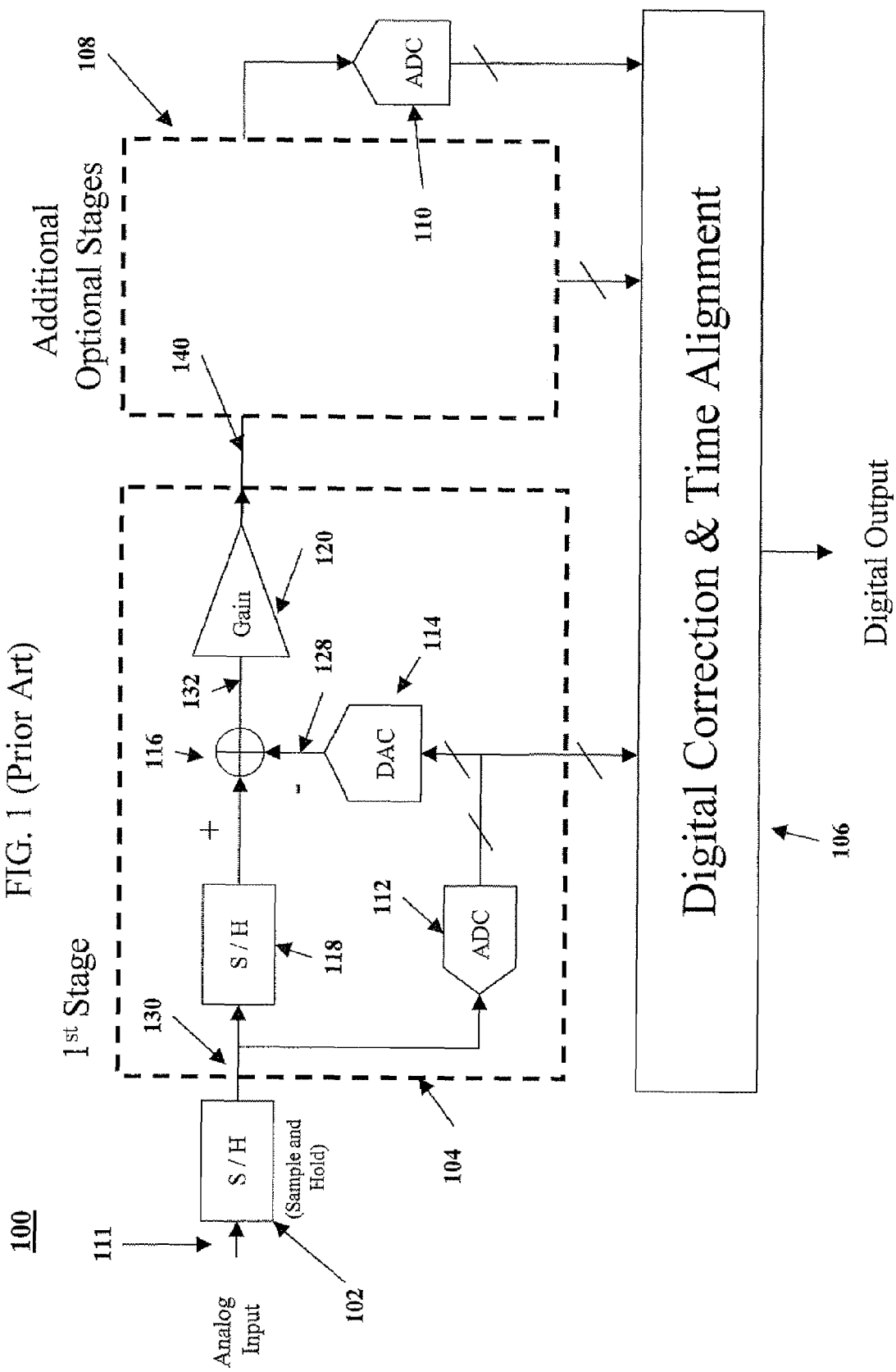
FIG. 1 shows a prior art ADC system based on a P/S architecture.
Figure 2:
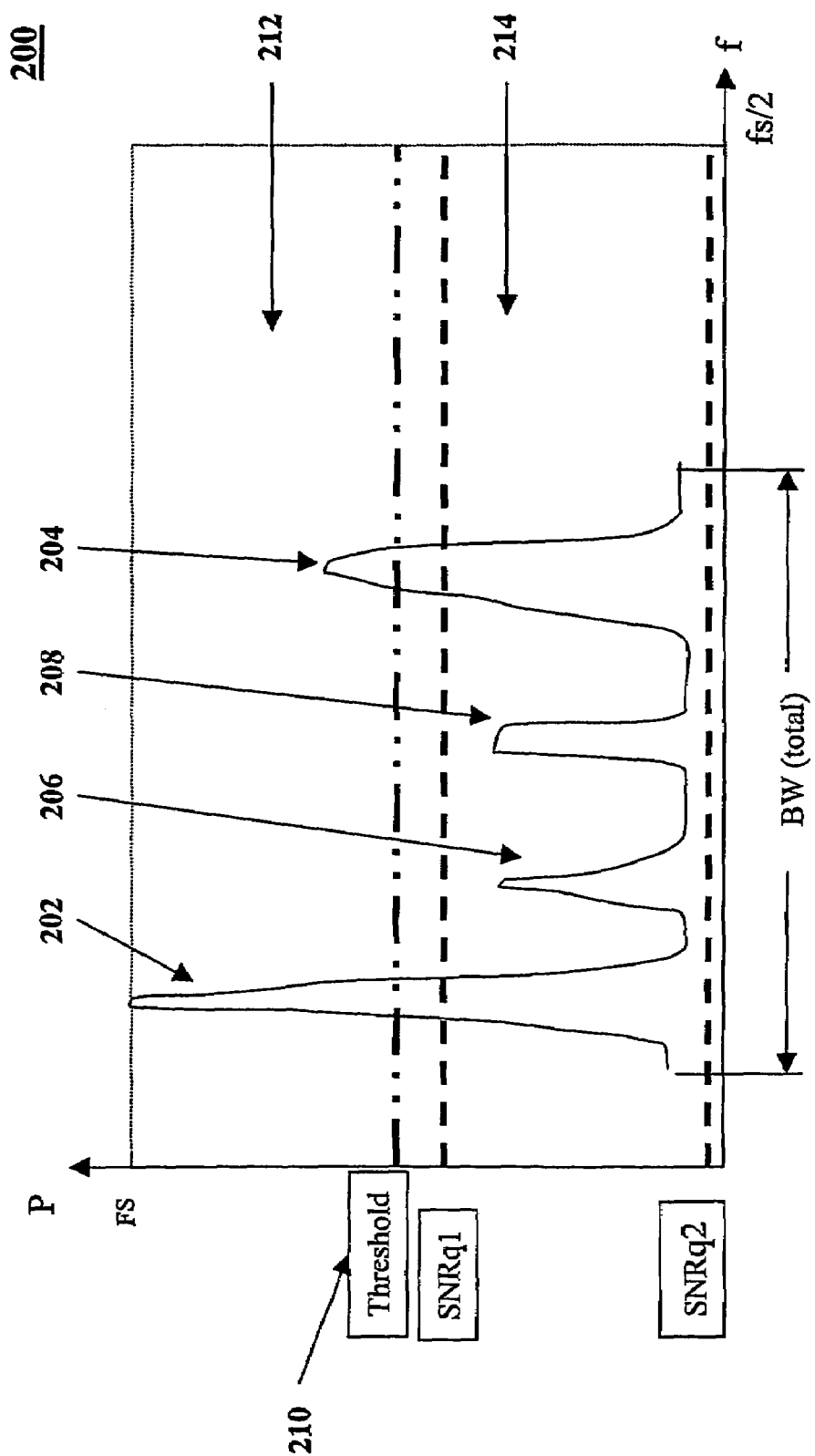
FIG. 2 shows the basic data conversion concept of the present invention, which is based on the processing of an incoming signal in the frequency domain.

FIG. 2 shows the basic data conversion "spectral" concept of the present invention. The concept is based on the processing of an incoming signal in the frequency domain by a spectral signal processor. The figure shows a signal power spectrum 200 with a sampling frequency $f_s$ and a signal total bandwidth BW, which may extend over all frequencies up to a Nyquist frequency $f_s/2$. Spectrum 200 comprises exemplarily both strong signals 202 and 204 and weak signals 206 and 208. The vertical axis represents the power spectrum DR in decibels (dB). According to the present invention, the dynamic range is divided into at least two parts. Exemplarily, in FIG. 2 the DR is divided by a spectral threshold 210 into an upper range ("above-threshold") part 212 and a lower range ("below-threshold") part 214. In an example of a system that has two ADCs in an S/P arrangement, "SNRq1" represents the quantization noise (QN) level of a first ADC (referred to below as ADC1), while "SNRq2" represents the final QN level of the overall ADC, which in this case is the QN of the second ADC (referred to below as ADC2). The threshold is chosen to have a certain value above SNRq1.

We define the spectral window of the frequencies above-threshold in FIG. 2 as W1, and the "spectral" window of the frequencies below-threshold in FIG. 2 as W2. For example, when a Fast Fourier Transform (FFT) is used, W1 is a vector with "1" at all FFT frequency bins above-threshold, and "0" at all FFT frequency bins below-threshold. W2 is a vector with "1" at all FFT frequency bins below-threshold, and "0" at all FFT frequency bins above-threshold.

Figure 3:
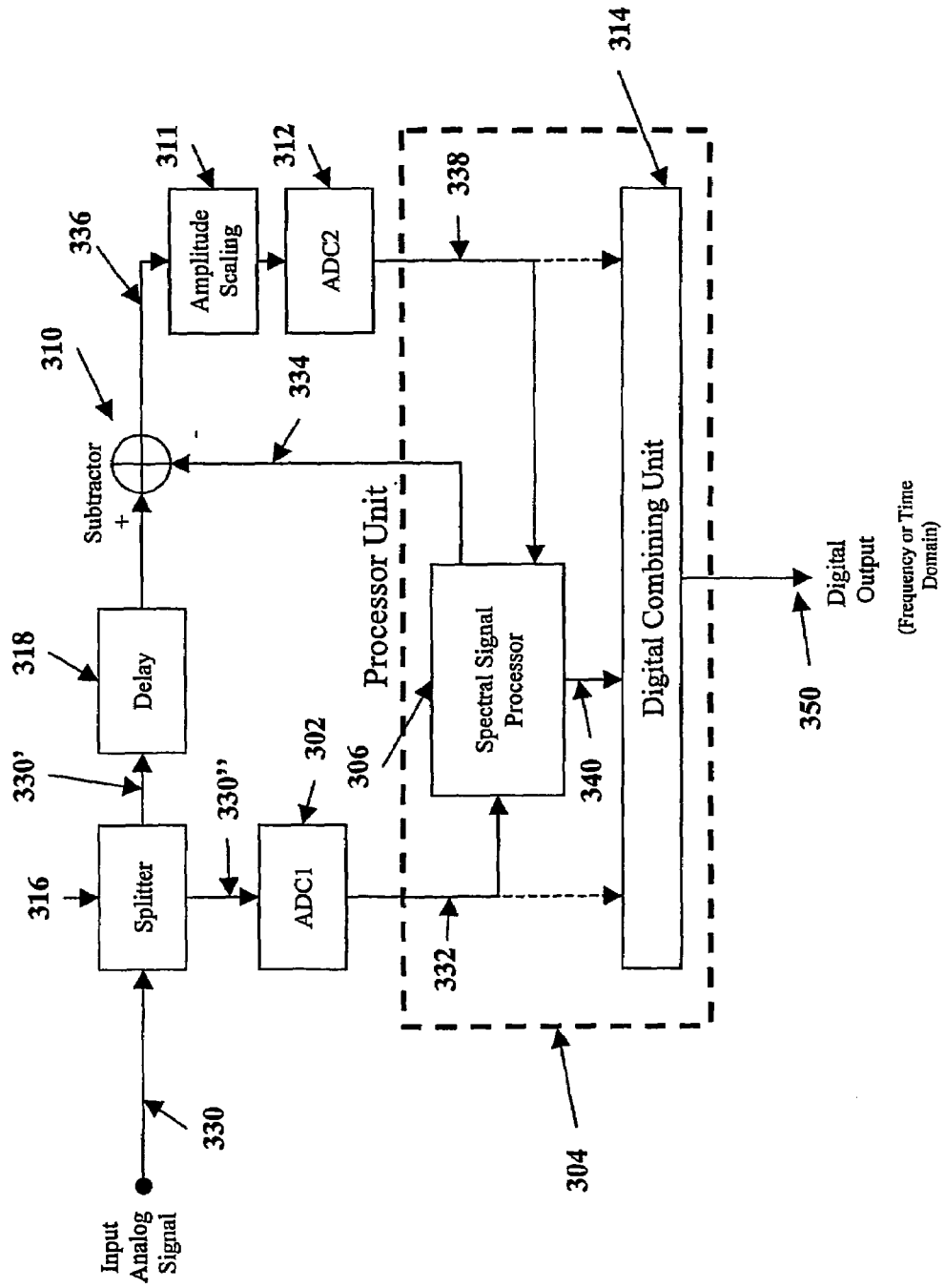
FIG. 3 shows a block diagram of a preferred embodiment of an ADC system of the present invention with a S/P arrangement that can implement the frequency domain (spectral concept) of FIG. 2.

FIG. 3 shows schematically a preferred embodiment of a basic high-resolution, high-speed ADC system 300 of the present invention, which can implement the frequency domain (spectral) concept of FIG. 2. System 300 comprises a first low-resolution ADC (ADC1) 302, a processing unit 304 that includes a spectral (frequency domain) signal processor ("spectral processor") 306, a digital combining unit 314, a subtractor 310, an amplitude scaling unit 311 and a second low-resolution ADC (ADC2) 312, interconnected as shown. Amplitude scaling unit 311 preferably includes a Gain or Automatic Gain Control (AGC) function (not shown) operative to amplify the subtractor output, preferably to the required maximum linear range of ADC2. System 300 further comprises a signal splitter 316 connected preferably through a delay 318 to subtractor 310.

In use, a time domain analog input signal 330 is divided in splitter 316 into a "main channel" analog signal 330' fed to subtractor 310 through delay 318, and into a "subtraction channel" secondary analog signal 330" fed to ADC1. After digitization in ADC1, signal 330" emerges as a converted first digitized output signal 332, which is fed to spectral processor 306. Advantageously, and in contrast with prior art conversion procedures, processor 306 performs at least one operation on digital signal 332 in the frequency domain and provides an analog "above-threshold" subtraction signal 334, which is fed to subtractor 310. This at least one operation includes extraction of the frequency domain information of signal 332. The processor also performs digital filtering of the below-threshold (W2) frequencies to attenuate these frequencies. Analog signals 330' and 334 undergo subtraction in subtractor 310, the result of which subtraction is an analog error signal 336 that is passed on to ADC2 through amplitude scaling unit 311. In order to minimize error signal 336, "above-threshold" processed signals 334 should have essentially the same phase amplitude and delay as the signals in the main channel. This phase amplitude and delay equalization is one of the functions performed by spectral processor 306.

ADC2 digitizes error signal 336 and outputs a second digital output signal 338, which is also fed to spectral processor 306. Advantageously and preferably, processor 306 processes signal 338 in the frequency domain and feeds the resulting frequency domain processed digital signals 340 (both "above-threshold" and "below-threshold" in FIG. 2) from both ADC1 and ADC2 to digital combining unit 314. Unit 314 linearly recombines signals 340 to provide a final combined digital output 350. Output 350 may be an output in the frequency domain, time domain or both domains. Digital combining unit 314 also performs time alignment and digital corrections. Optionally, the ADC1 and ADC2 output signals (332 and 338) can be processed by the digital combining unit to provide a time domain output.

Figure 4:
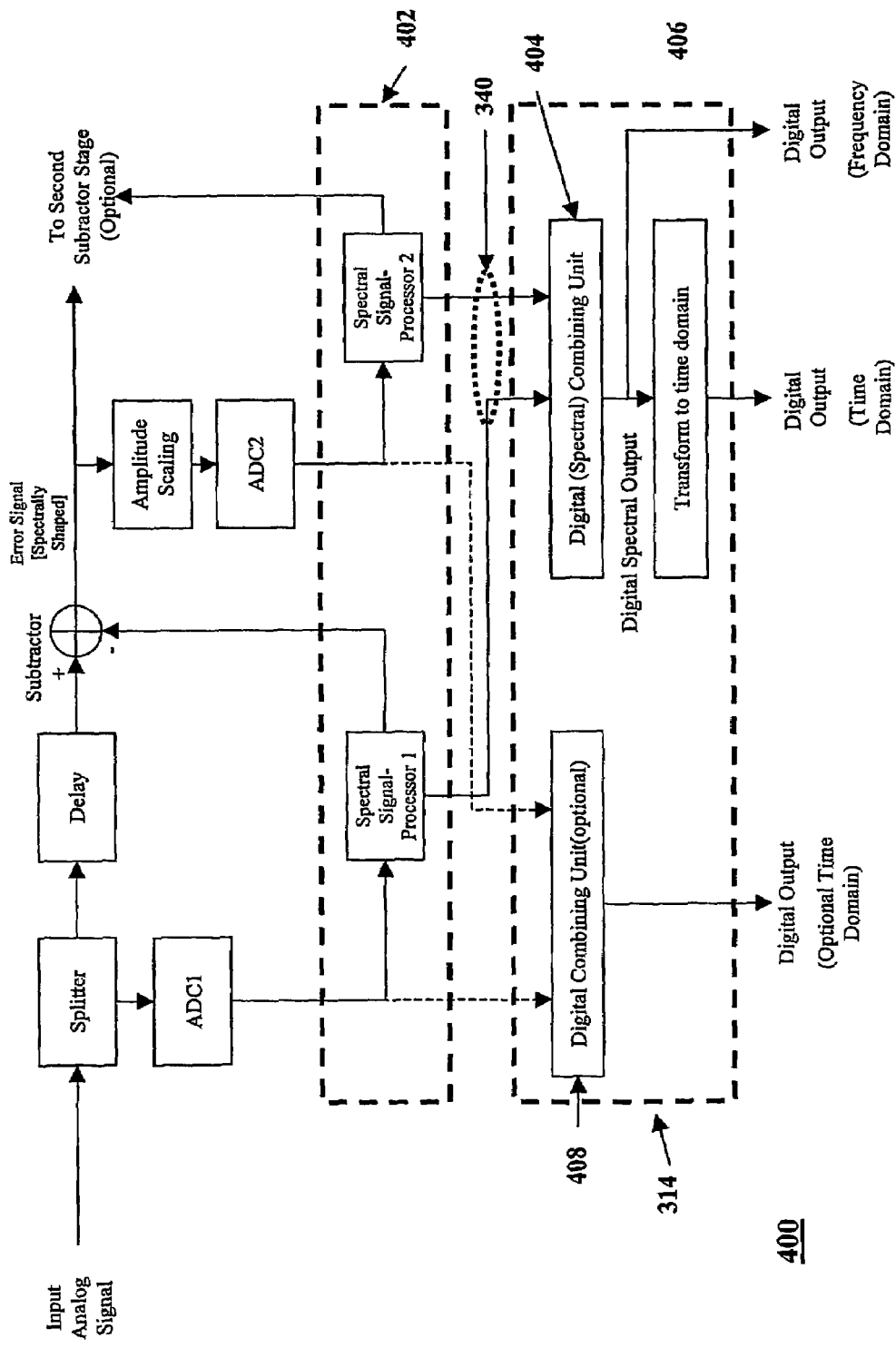
FIG. 4 shows the system in FIG. 3, with more details of the digital combining unit.

FIG. 4 shows a system 400 similar to system 300, with more details of digital combining unit 314. In FIG. 4, combining unit 314 is shown to include a frequency domain ("spectral") combining unit 404 that has an optional digital frequency domain output, and a transform-to-time domain unit 406 that provides a time domain digital output. Optionally, system 400 further comprises a separate second digital combining unit 408 for combining the outputs of ADC1 and ADC2. A processor 402 represents at least one optional second spectral signal processor coupled to ADC2 and to the digital combining unit and operative to provide at least one additional subtraction stage.

Figure 5:
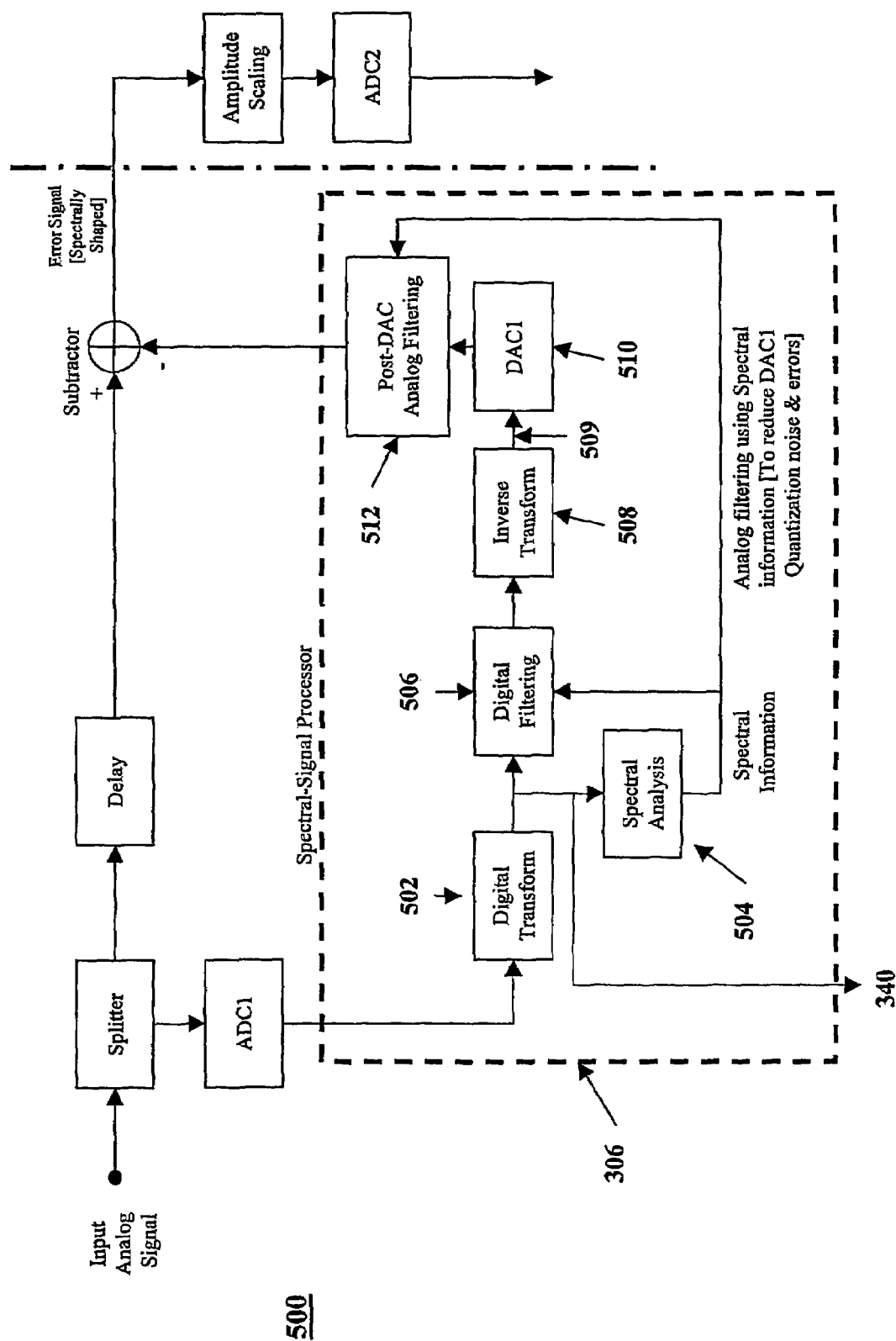
FIG. 5 shows a block diagram of a possible embodiment of the spectral processor in FIG. 4, which also includes an additional first method to improve the DAC performance limits.

FIG. 5 shows a block diagram of an embodiment of a spectral processor in FIG. 4. The figure also illustrates a way to improve the DAC performance limits ("post-DAC filtering"), thereby providing an additional performance improvement (referred to below as a "second performance jump" which is additional to the basic improvements of the invention (termed "first jump"). This second performance jump also represents a unique improvement of the basic physical limits of a converter, e.g. of aperture jitter and non-linearity.

In FIG. 5, signal processor 306 comprises a transform unit 502, a frequency domain information extractor (also termed "spectral analysis") unit 504, a digital filtering unit 506, an inverse transform unit (e.g. an inverse FFT or IFFT) 508, a first DAC (DAC1) 510 that has the high-speed sampling rate of the entire system, and a post-DAC analog filtering unit ("filter") 512, interconnected as shown. Transform unit 502 (for example an FFT, which is also used for spectral analysis) is used to transform the signals from the time domain to the frequency domain. While an FFT is not the only known processing tool for spectral analysis (others like Filter Bank can also be used with certain advantages depending on the application), it is the most widely used. Spectral analysis unit 504 is operative to perform spectral processing based on the concept shown in FIG. 2. i.e. to divide a frequency domain signal received from transform unit 502 into at least two parts, by identifying the upper part with a threshold. The spectral (frequency) information from unit 504 is used to perform digital filtering in unit 506, which strongly attenuates the below-threshold frequencies and passes the "above-threshold" frequencies (W1) without attenuation. The resulting output from unit 506 is fed to inverse transform unit 508. The result of the inverse transform is fed to DAC1 510. If DAC1 has a sufficiently high-resolution to provide the needed final resolution of the overall converter, then its output goes to subtractor 310. If DAC1 does not have the required resolution or if a lower resolution DAC is preferred, post-DAC analog filtering unit ("filter") 512, which is inventively and advantageously incorporated in the spectral signal processor and connected to DAC1, receives and filters the DAC1 output Filter 512 is adaptively controlled by the same digital spectral information from unit 504. Optionally, an equivalent time-domain digital filter (not shown) controlled by the same spectral information can be used directly from the output of ADC1 to feed the input of DAC1. One important advantage of the post-DAC filtering is the improvement of fundamental limits of the overall converter (like aperture jitter, non-linearity, etc.) This filtering improves the critical DAC quantization noise and errors such as spurs, in a similar manner to the improvements by digital filtering of ADC quantization noise and error in unit 506.

The post-DAC filtering in filter 512 provides the "second jump" in performance mentioned above. This second jump is important when the required DAC1 resolution is not available, or when a lower DAC1 resolution is beneficial for cost, power, complexity, chip area or other reasons. The analog filter errors can be further reduced and optimized by proper equalization (see below). Many types of digitally controlled analog filters may be used to implement filter 512, depending on the specific application and technology (e.g. different mixed signal chip technologies or module technology). For example, Phase Lock Loops (PLL) can be used as an adaptive filter by tuning them to the spectral peaks with added proper amplitude modulation. This tuning is further compensated by an equalizer, see description of FIG. 7 below. Advantageously, the post-DAC filter does not have to be accurate, because of this compensation.

In summary, in contrast with the traditional P/S, which is done in the time domain and per short sampling pulse, the data conversion architectures and methods disclosed herein use the signal in the frequency domain shown in FIG. 2, and use spectral tools. The "below-threshold" frequencies are digitally filtered to remove quantization noise and other ADC1 errors in the "below-threshold" frequency range. After reconstruction of the signal, with for example a DAC, the "above-threshold" signal spectrum is subtracted from the input signal. The delay in the main channel compensates for the subtraction channel delay.

Figure 6:
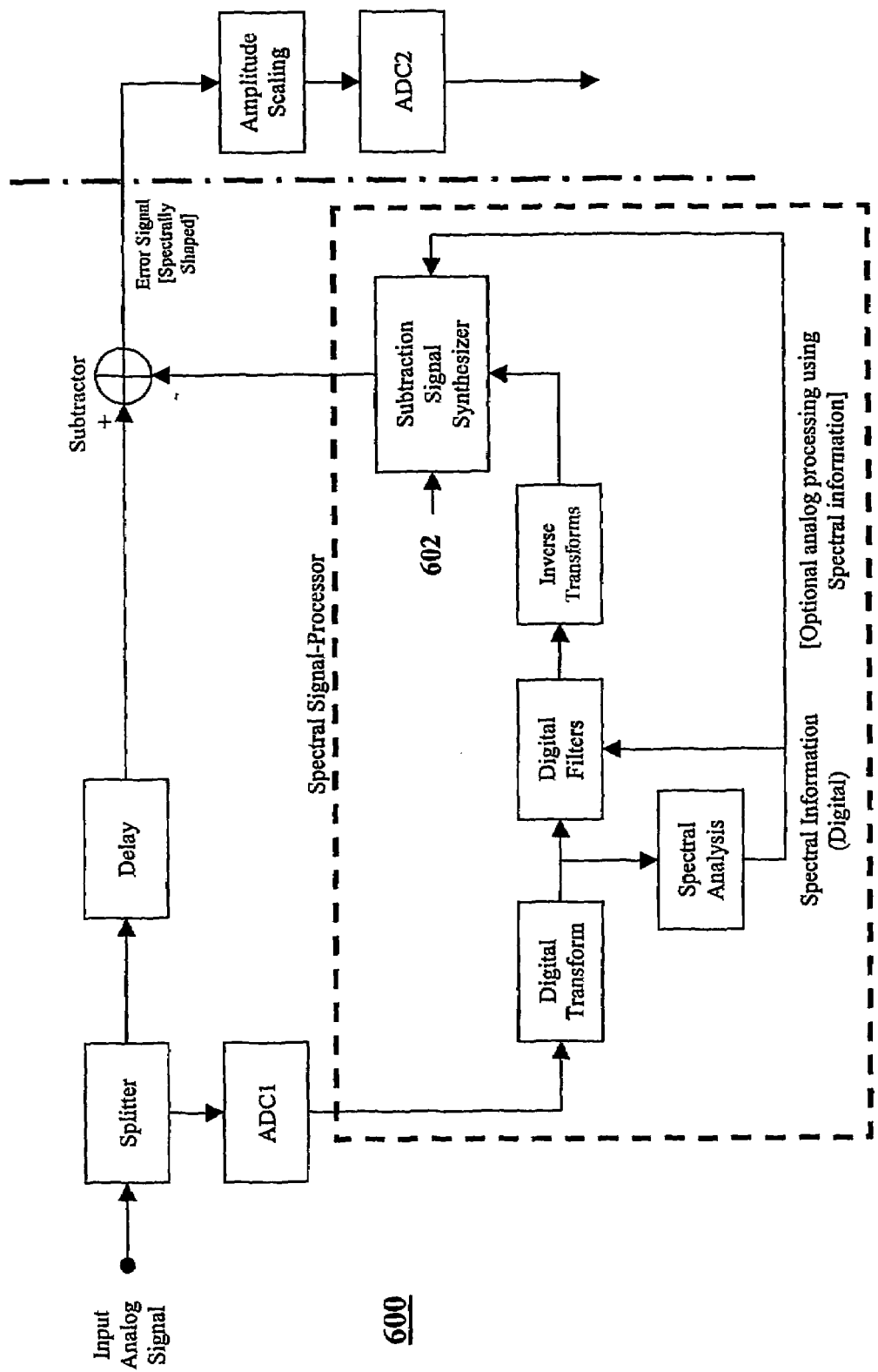
FIG. 6 shows an exemplary system similar to the one in FIG. 5, with a second method of improving the DAC performance: a subtraction signal synthesizer replaces the first DAC and the post DAC filter of FIG. 5.

FIG. 6 shows yet another optional embodiment of the architecture, which can be used to improve the DAC quantization noise and errors, i.e. to achieve the "second jump" in performance mentioned above. In FIG. 6, an exemplary system 600 has elements similar to those of system 500 in FIG. 5, except that DAC1 and post DAC filter 512 are replaced by a subtraction signal synthesizer 602. Synthesizer 602 typically comprises a parallel arrangement of at least two lower-performance DACs (in a parallel, frequency interleaving arrangement) and performs the synthesis described next. Each DAC in the synthesizer has a respective digital filter and inverse transform function.

In use, the digital spectral information (in window W1) is used to synthesize the required signal at the "above-threshold" frequencies. In many practical applications, this part of the spectrum is narrowband, with few above-threshold signals, as for example in the GSM blocker specifications (e.g. GSM 05.05 and GSM 05.02 technical specifications), which specify one or two (depending on the transmission frequency band) narrowband locking signals. Advantageously, the synthesis can be done by using a few DACs with lower sampling rate and higher resolution than DAC1 (e.g. band-pass Sigma-Delta DACs known in the art) that can be tuned by the spectral information (center frequency and bandwidth) to synthesize the above-threshold spectrum. Naturally, all "spectral peaks" that reside within the Nyquist bandwidth of a high-resolution DAC can be synthesized with one high-resolution DAC and one inverse transform. In this sense, the synthesizer can itself serve as an implementation of a DAC that uses the spectral concept of FIG. 2. In other words, a high-performance DAC may be obtained using at least two lower performance DACs in a frequency interleaving arrangement, where one of the lower performance DACs has the same high-speed (Nyquist bandwidth) but lower resolution than the high-performance DAC. The other (one or more) DACs in this arrangement are preferably lower-speed, high-resolution DACs, as explained below.

The improvement of the DAC performance using the frequency information of the signal by the method performed with either one of the architectures of FIG. 5 or FIG. 6 can also be applied to oversampling (Sigma-Delta) ADCs, where the DAC performance is important to improve the overall performance of the converter. Also, the two methods (performed using the architectures of FIGS. 5 and 6) can be combined to further improve performance. This may be done by using the post-DAC filters of FIG. 5 at the outputs of the "above-threshold" lower speed DACs, and the same frequency domain information as before.

Figure 7:
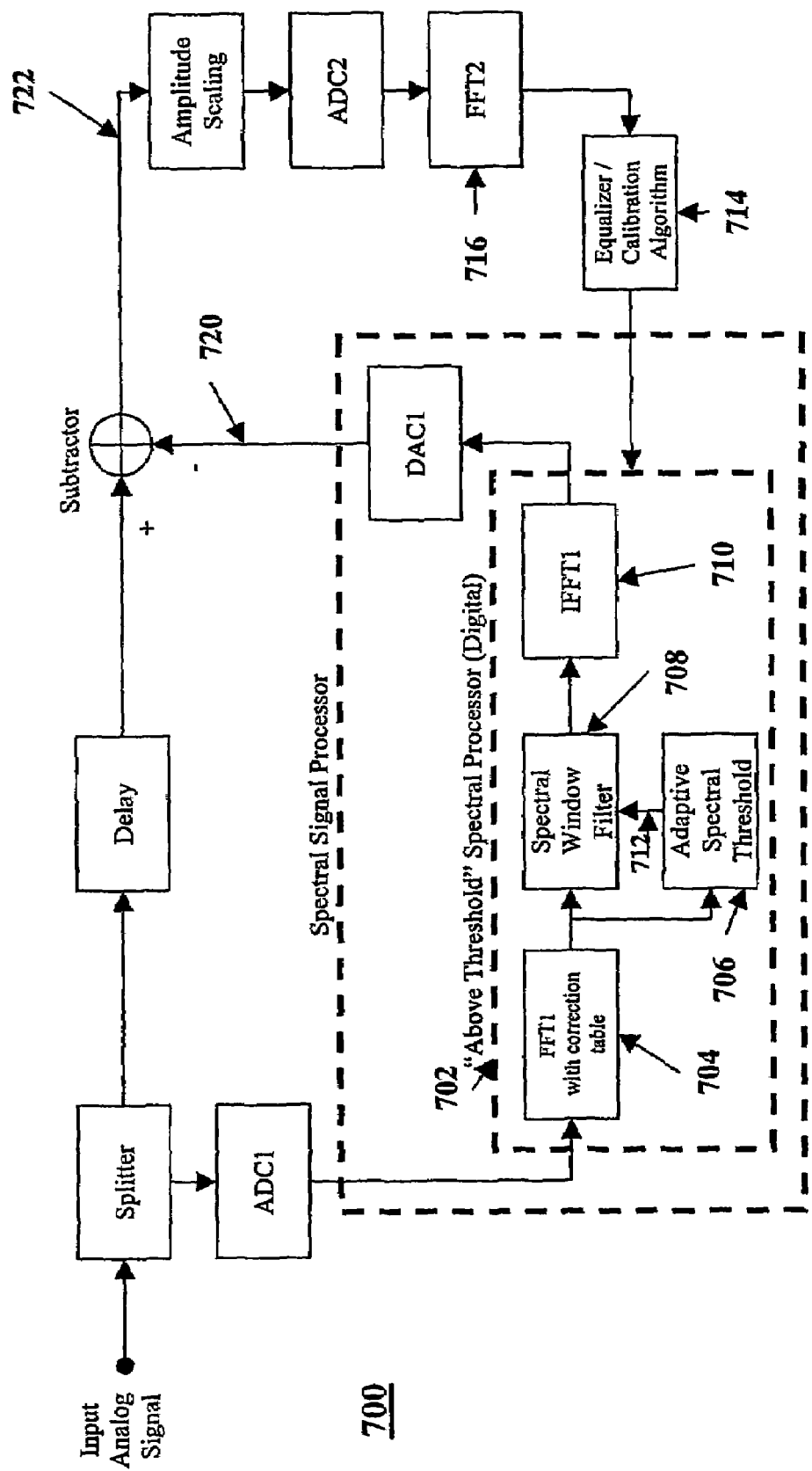
FIG. 7 shows an embodiment a system with a FFT (Fast Fourier Transform) similar to the system in FIG. 5, but without the post-DAC filtering unit (which can be added independently) as well as without the subtraction signal synthesizer arrangement of FIG. 6.

FIG. 7 shows an embodiment a system 700 similar to systems 500 and 600, but without the post-DAC filtering unit of FIG. 5 (which can however be added independently), as well as without the subtraction signal synthesizer arrangement of FIG. 6. System 700 includes an exemplary implementation of an above-threshold spectral processor 702. Spectral processor 702 comprises a first FFT (FFT1) unit 704, which includes a correction table at its output (not shown), an adaptive spectral threshold unit 706, a spectral window filter 708 and a first inverse FFT (IFFT1) unit 710, interconnected as shown.

In use, adaptive spectral threshold unit 706 provides an output 712 of the "above-threshold" window W1 of FIG. 2. Output 712 goes to spectral window filter 708, which passes all the "above-threshold" FFT1 frequencies and strongly attenuates all the "below-threshold" frequencies to filter out ADC1 quantization noise and other spectral errors. System 700 further comprises an equalizer/calibration algorithm block 714, preferably connected to, and receiving an input from a second FFT unit (FFT2) 716, which in turn receives an input from ADC2. Equalizer/calibration algorithm block 714 controls the correction table at the output of FFT1, which is used in a well-known manner.

The equalizer is used to equalize the "main channel" (from the splitter to the subtractor including the delay) to the "subtraction channel" (which includes the spectral signal processor) over the band of interest ("above-threshold" frequencies). The equalization includes amplitude, phase and delay adjustments. This results in cancellation of the "above-threshold" spectrum (ideally to the level of the QN SNRq1 of ADC1). The equalizer compensates for errors over the frequency band up to the narrow FFT bin resolution.

Many methods and adaptive algorithms are known in the art for calibration/equalization, using calibration signals or blind (no calibration) signals, or off-line or on-line (in the background without interrupting the normal operation of the converter) techniques. A good reference for such methods in the context of data converters may be found in G. Cauwenberghs and G. C. Temes, "Adaptive Digital Correction of Analog Errors in MASH analog-to-digital converters—Part I. Off-Line and Blind On-Line Calibration," *IEEE Trans. Circuits and Systems II*, vol. 47 (7), pp. 621-628, July 2000. Widely used adaptive algorithms include the LMS (Least Mean Square) algorithm and others, described for example Simon Haykin, "Adaptive Filter Theory", $3^{rd}$ edition, Prentice Hall, 1996.

A preferred embodiment and method of use of the equalizer includes a frequency domain equalizer that uses the existing digital frequency domain hardware (FFT1 and FFT2) with the addition of an FFT1 correction table and of equalizer/calibration algorithm block 714. The readings of the FFT2 bins are used as an error signal to be minimized. Advantageously, this equalization can be done very fast. The FFT used for the frequency domain equalizer also advantageously allows for fine delay adjustment (within a small fraction of sampling clock time) by linearly changing the phase from bin to bin.

The delay in FIG. 7 and all other figures can be implemented for example with a commercial low cost SAW filter, used also as an anti-aliasing filter (AAF) in handheld/mobile and other communication terminals. The SAW can provide up to few μsec delay. The SAW can also be used as part of the AAF needed for the ADC2, so that the AAF at the input to the overall ADC can be limited to the filtering of low-resolution ADC1.

A number of algorithms are available to implement the adaptive threshold 706, e.g. blind and non-blind algorithms. The preferred and simple blind solution would be to use a frequency outside the signal band, where possible interferences are filtered by the AAF at the input. FFT frequency bins near zero or Nyquist ($f_s/2$) frequencies can be used to estimate the quantization noise level and set the appropriate threshold without disturbing the ADC operation. A higher spectral threshold can be used to filter the spurs due to nonlinearities of ADC1 (in addition to dithering and other known techniques). A "smart threshold" can also be used to further optimize performance for different scenarios and applications and change the threshold accordingly.

The reconstructed signals at the above-threshold frequencies at an output 720 of DAC1 (which includes an AAS) are coherently subtracted to reduce (cut) the ADC1 power spectra, approximately to the level of QN of ADC1 (SNRq1). This implies that at the subtractor output 722, the DR is reduced to approximately SNRq1 (i.e. the DR includes any processing gain of the strong signal (above-threshold)). Following AGC normalization of the signal, ADC2 now digitizes the residual spectrum rather than the wideband quantization noise.

A convenient implementation of the continuous signal needed for the subtraction channel of the above-threshold signals (and one that avoids spectral leakage of the rectangular window FFT) uses an OLA-FFT (Overlap-Add FFT) or similar type Filter Bank techniques (see e.g. J. Lillington, "Comparison of Wideband Channelization Architectures" ISPC 2003, Dallas, Tex., USA). Commercial components and chip cores are available with different speed, power, chip area and cost. The OLA-FFT also provides the required window. Hamming, Hanning or better resolution windows can be selected according to the DR needed for the filtering. This filtering operation is used to attenuate the quantization noise of the ADC at frequencies below-threshold, while allowing for subtraction/cancellation of the strong signals above-threshold.

Advantageously, the output of the subtractor does not contain wideband quantization noise to $f_s/2$, as do conventional S/P ADCs, but rather the true signal of the below-threshold frequencies. This implies that ADC2 will exhibit improvement of the quantization noise (SNRq2 improvement) by the processing gain (PG). For example, for a strong and weak signal scenario, if the strong signal spectral width is 0.01 of the sampling frequency $f_s$, the additional improvement of SNRq2 will be 27 dB, which represents about 2.83 additional resolution bits. This improvement in resolution will occur in every subtraction stage. Consequently and advantageously, lower resolution ADCs may be used in many applications.

Figure 8:
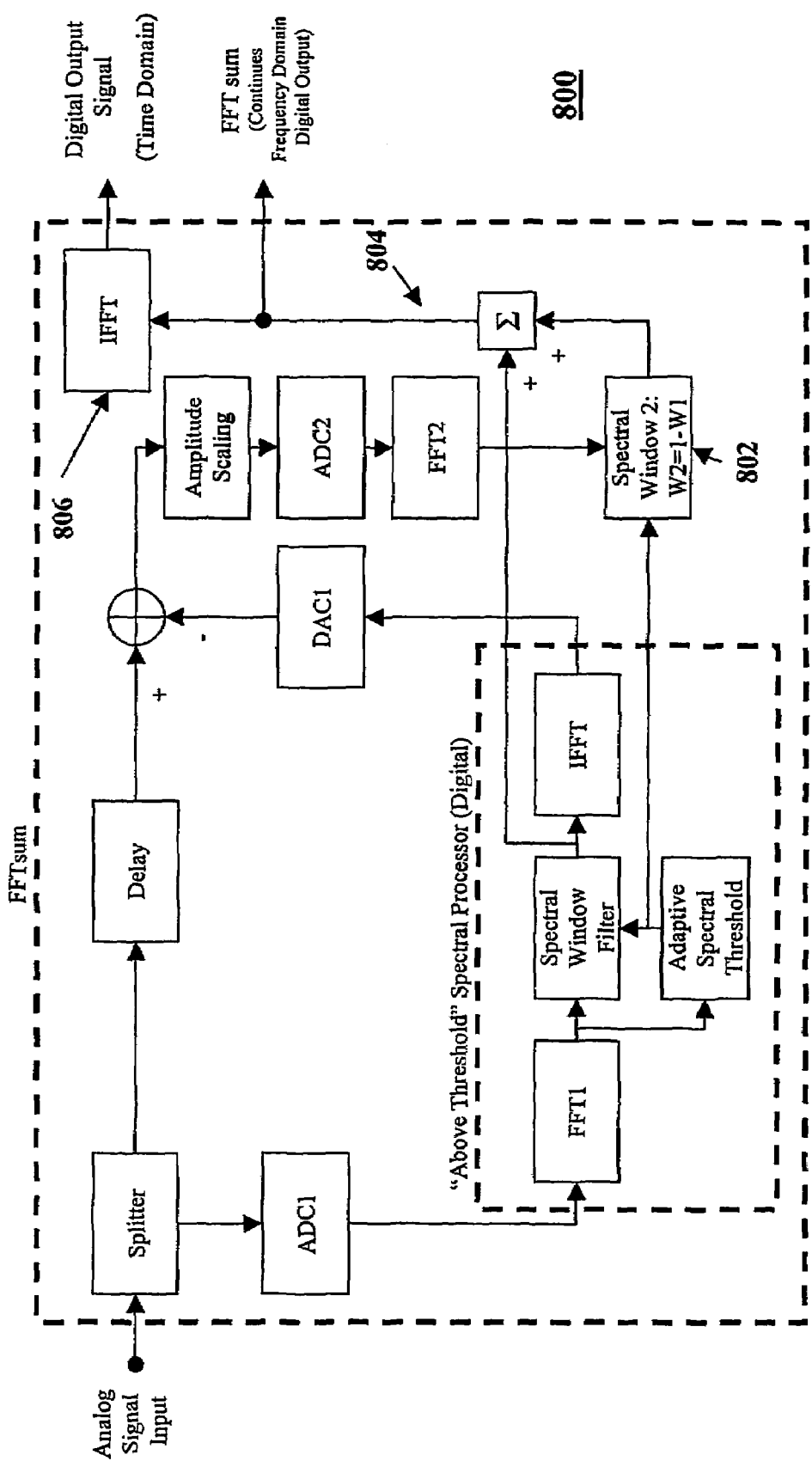
FIG. 8 shows a system similar to the system in FIG. 7, with more details of the digital combining unit.

FIG. 8 shows an embodiment of an exemplary system 800 similar to system 700, but with more details of the digital frequency domain combining process. System 800 comprises in addition to the elements in FIG. 7 a second spectral window filter 802, connected to a digital summer (for vectorial summation) 804, which is further connected to an IFFT 806. Second spectral window 802 passes all the "below-threshold" FFT2 frequencies and strongly attenuates (nulls) all the "above-threshold" frequencies. The summer recombines the FFT readings below and above-threshold to get "FFT sum", which represents the FFT of the complete input signal. FFT sum can be used advantageously as an output for many applications (e.g. for channelization of the signal or filtering). IFFT2 is used to provide a digital output signal in the time domain. For narrow band "above-threshold" signals, the delay length can be shortened or eliminated with certain trade-offs in performance. The equalizer will compensate for part of the loss.

Advantageously, further improvement of the converter resolution within the narrow-band FFT bin is possible by subtraction of an equalized FFT2 output from the FFT1 output (at the "above-threshold" frequencies), before the final combining of FFT1 and FFT2 outputs to obtain FFT-sum in FIG. 8.

Similar to the calibration of the P/S stages, calibration is done herein between different spectral stages. This calibration ensures smooth summation of the FFTs at the FFTsum output, and avoids jumps between FFT1 and FFT2, for example in the spectral threshold region. The calibration can be implemented by equalizing the FFT bins in the threshold region. Blind calibration using the input signal is possible in this region, which may simplify the calibration process.

Figure 9:
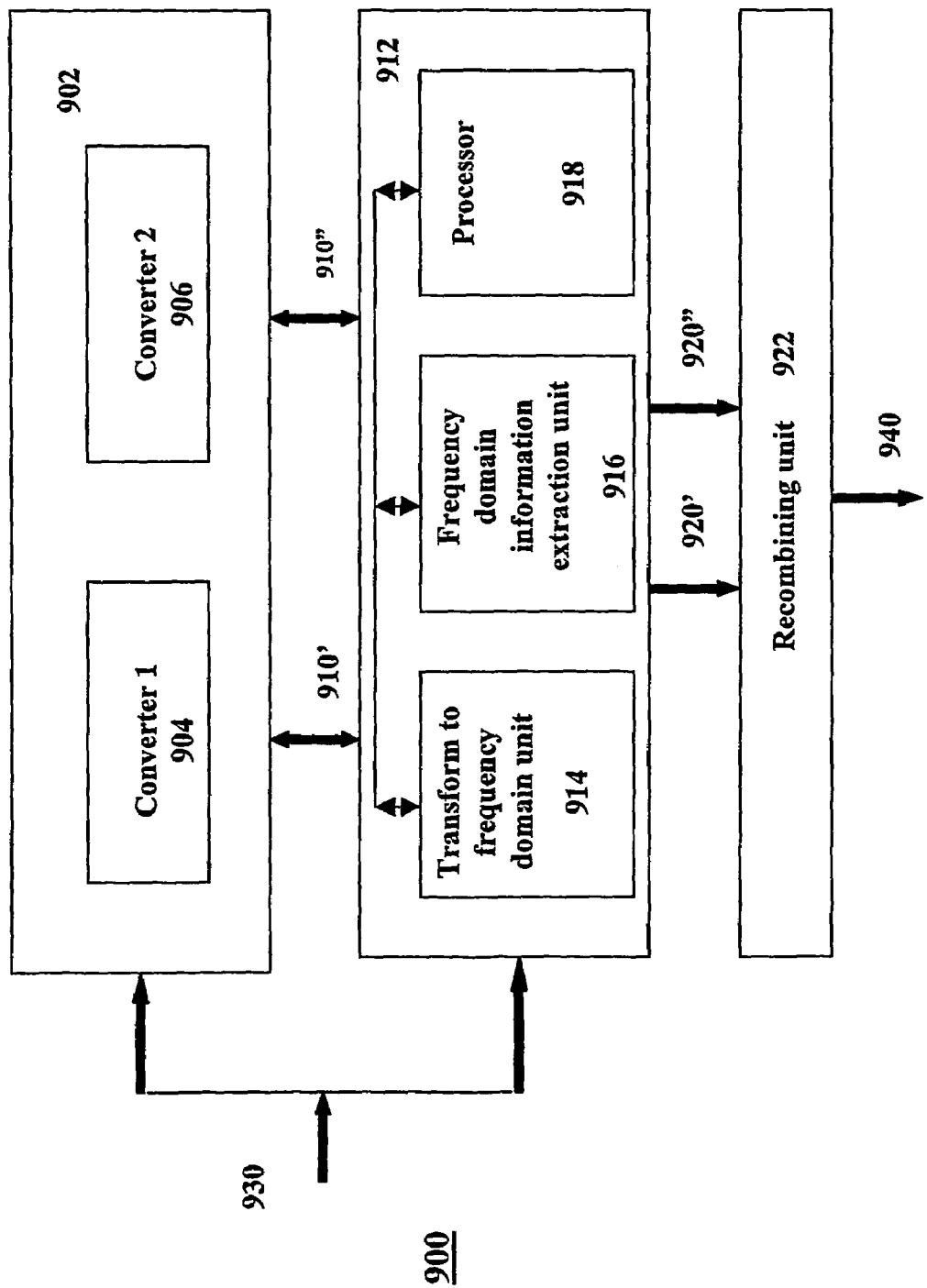
FIG. 9 shows a general preferred embodiment of a high-performance (i.e. high-resolution, high-speed) data converter architecture and system according to the present invention.

The various embodiments of the inventive conversion architecture disclosed herein may be represented by a general high-performance (i.e. high-resolution, high-speed) converter 900 shown in FIG. 9. Converter 900 illustrates the key inventive features disclosed herein, and in particular the feature of frequency domain processing of a signal using spectral (frequency) information according to the concept of FIG. 2. Converter 900 comprises a conversion unit 902, a processing unit 904 and a recombining unit 906, interconnected as shown. Conversion unit 902 includes at least two data converters having each at least one lower performance parameter than a respective final parameter that characterizes the high-performance converter, and is operative to perform ADC or DAC conversion on an input signal 930, and to exchange information bi-directionally with processing unit 912. Processing unit includes a transform unit 914 that performs a transform from the time domain to the frequency domain on the same input signal 930, an inventive frequency domain information extraction unit 916 operative to extract frequency information from the signal according to the concept of FIG. 2, and a processor 918 operative to process the extracted frequency information. Transform unit 914, extraction unit 916 and processor 918 are coupled to each other. Processing unit 912 outputs two, at least partially frequency domain processed signals 920' and 920' to recombining unit 922. Unit 922 recombines signals 920' and 920" into a single final output signal 940.

In an exemplary comparison with the converter systems in FIGS. 3-8, conversion unit 902 represents ADC1 (equivalent to 904) and ADC2 (equivalent to 906). Processing unit 912 represents the spectral signal processor in FIGS. 3-7 and the "above-threshold" spectral processor plus DAC1 in FIG. 8. Recombining unit 922 is equivalent to digital combining unit 314 in FIGS. 3 and 4. The internal elements in processing unit 912 are also easily identifiable: transform to frequency domain unit 914 represents the digital transform unit in FIGS. 5 and 6, and FFT1 in FIGS. 7 and 8. Frequency domain information extraction unit 916 represents the spectral analysis unit in FIGS. 5 and 6, and the adaptive spectral threshold unit in FIGS. 7 and 8. Processor 918 represents the rest of the elements inside the spectral signal processor in each embodiment, i.e. the digital filtering unit, the inverse transform, DAC1 and the post-DAC filter in FIG. 5, the digital filtering unit, the inverse transform and the subtraction signal synthesizer in FIG. 6, and the spectral window filter, IFFT1 and DAC1 in FIGS. 7 and 8.

The frequency interleaving arrangement of parallel DACs can be used similarly to build a high performance (high speed, high resolution) DAC, according to FIG. 9b and the frequency domain concept of FIG. 2. The high-resolution DAC is similar to the spectral synthesizer explained in FIG. 6. One or more high resolution, low speed DACs (DAC bank) are used to separately synthesize the spectral peaks of the "above-threshold" (W1) signals as described in FIG. 6. One low-resolution, high-speed DAC that covers the full Nyquist bandwidth of the overall DAC is used to synthesize the signal at all "below-threshold" frequencies W2. The recombining unit in FIG. 9 for a DAC is an analog combiner of all these DACs to achieve both high-speed and high-resolution. Calibration/equalization is used to match all the analog signals entering the combining unit, similar to the calibration/equalization using calibration tables of FFT1 and FFT2 described in FIG. 7 and FIG. 8. The frequency domain information (W1 and W2) is derived in the case of a DAC directly from the digital input (instead of using the output of ADC1 in FIG. 7) by using blocks similar to 704, 706 with a separate spectral window filter (708) and IFFT (710) for each "spectral peak" above-threshold. As mentioned, a "post-DAC" filtering of the spectral peaks described in FIG. 5 can also be added to provide an additional improvement of the resolution.

A wide variety of digital spectral analysis and signal processing tools can be used to optimize and improve the performance of architectures and methods disclosed herein for different applications and requirements (reduce processing requirements, improve power, adapt to production technologies, etc.). For example:

(1) Digital filters can be cascaded with the FFT filtering for better performance of the strongest spectral peaks.

(2) Filters with minimum delays can be used when maximum resolution for a given SAW delay is needed.

(3) A filter bank implementation may be sometimes preferred to OLA-FFT for lower computational requirements or better frequency resolution (4) Non-uniform frequency spacing may be used over the Nyquist bandwidth (if only part of the Nyquist bandwidth is used).

(5) A slower, longer FFT may be used to analyze the signal spectrum with greater resolution, and to supervise the continuous time FFT and filtering.

In addition to the direct use of the FFT (or equivalent) for the conversion purposes set forth herein, the FFT may also be also used: a) for correction of the DAC nonlinearities and other analog channel non-linearities as known in the art; b) at the output (FFTsum) for combining several ADCs in parallel (to further increase sampling rate) by use of filter bank ADC methods; and c) in the FFTsum for channelization of multiple signals.

Exemplary Simulation Results

We performed exemplary MATLAB™ computer simulations according to the embodiments of FIG. 7 and FIG. 8 to demonstrate the operation and other features of the ADC architectures therein. In addition to the simulation of the ADC, a typical communication transmit/receive channel was simulated using the disclosed ADC with a QPSK (Quadrature Phase Shift Keying) receiver in the time domain, to demonstrate the operation of both the frequency domain and the time domain outputs of the ADC.

FIG. 10 shows a simulation of two QPSK carriers, the simulation done with two lower-performance ADCs (ADC1 and ADC2) each of 5 bit resolution (and an effective number of bits (ENOB) of 3.8 bits). The generated signals were strongly filtered outside the pass band to allow for wide DR measurements. The strong signal (S1) amplitude is at full scale (i.e. A1=1) and the weak signal (S2) amplitude A2=0.002. The total input signal is conditioned by an AGC to tune it to the maximum allowable input range while avoiding saturation of the ADC. Full scale is marked "FS" on FIG. 10-A. The vertical axis in each of FIGS. 10-A, B, C, E, G, H and FIGS. 11-A, B represents power spectral densities (PSDs) shown in 20 dB/div. The horizontal axis is these figures represents normalized frequency. The Nyquist frequency is at 1.57.

FIG. 10-A shows the PSD of an input signal (composed of strong S1 and weak, S2 carriers) before ADC1. A quantization noise level (SNRq1) is added to the digital output of ADC1. Similarly a second quantization noise level (SNRq2) can be seen at the output of ADC2 in FIG. 10-B.

FIG. 10-B shows the PSD of the signal after ADC2 (the weak signal is also added to the figure for comparison). The differences between the spectrum of the weak signal at the input and at the output can hardly be noticed above the SNRq2 level. The "above-threshold" signal (which in this case is the strong signal) is reduced approximately to the level of SNRq1 of ADC1. Comparing the two FIGS. 10-A and B we can see that while the quantization noise SNRq1 at the output of ADC1 (10-A) is more than 20 dB above the weak signal, at the output of the subtractor (and ADC2) in 10-B, this level is reduced by about 31 dB, and the weak signal can be detected. FIG. 10-C is the frequency domain output FFTsum (804 in FIG. 8), which demonstrates the full linear dynamic range at the digital output. Notice that the final SNR at the output of ADC2 (SNRq2) and the DR improvement by about 31 dB are more than the ENOB=3.8 Bit (22.8 dB) of ADC2. This represents an additional PG advantage of about 8.2 dB compared to prior art P/S architectures/methods. As shown in FIG. 10-D, which shows the QPSK signal constellation, the weak signal can now be detected by the QPSK receiver from the time domain output (see FIG. 8).

A scenario of two strong equal signals is shown in FIG. 10-E, with the signal constellation of the strong signal shown in FIG. 10-F. FIG. 10-G shows frequency domain results for a 7 bit ADC (with ENOB=5.7 bits), A1=1 and A2=0.000004, which can be compared to those in FIG. 10-C.

The significant increase in performance for a narrower band (higher PG) "above-threshold" signal (representing narrower carriers or increased sampling rate) is demonstrated in FIG. 10-H for a strong CW signal. Line A is the SNRq1 of ADC1, and line B is the final SNRq2 of a conventional S/P converter. The SNRq2 using the architecture and method of the present invention is about 25 dB (more than 4 additional bits) lower than that of the traditional S/P architecture (line B). FIG. 10-H also represents the ADC behavior to narrow band blockers typical to communication standards such as GSM and advanced generation communications.

FIG. 11 demonstrates the calibration/equalization operation and improvement for different channel error levels (large errors, small errors and no errors). FIG. 11-A shows the PSD before the calibration, and FIG. 11-B shows it after the calibration, both showing the signal at the output of ADC2 (similar to 10-B). We assumed intentional large initial errors between the main channel and the subtraction channel: amplitude error=0.5 (6 dB), phase error=0.5 radian (~28 degrees) and delay error=50 (sampling clock time).

FIG. 11-A (when compared to FIG. 10-B) shows that as expected, un-calibrated, large channel errors do not allow proper subtraction and detection of the "below-threshold" weak signal. After activation of the calibration/equalization described in FIG. 7, proper operation and detection of a weak signal is possible (FIG. 11-B). FIG. 11-C summarizes the equalizer improvement for a case of a calibration signal as a function of its bandwidth, for different channel errors as a parameter. S=0 indicates initial errors before calibration/equalization. It can be seen that final errors are very small and represent a loss of a fraction of an ADC bit, even with large initial channel errors. In addition, the equalization algorithm described in FIG. 7 and demonstrated here is very fast (few FFT frames), which enables very fast update and also works well for blind (no calibration) signals.

Much higher sampling speeds are possible simply because the analog channel is represented by high-speed amplifiers, compared to much slower operational amplifiers and S/H circuits used in conventional S/P ADCs (because of the requirements for very high, final accuracy amplifiers and S/H that settles to the final accuracy/resolution within the short sampling time).

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A high-performance apparatus for data conversion, comprising:
   a. a conversion unit that includes at least two lower-performance converters, each said converter having at least one lower performance parameter than the high-performance apparatus for data conversion, said conversion unit operative to convert an input signal obtained in a time domain;
   b. a processing unit coupled to said conversion unit and operative to process digital frequency domain information extracted from said input signal, and, based on said processed frequency domain information, operative to provide in combination with said conversion unit at least two processed signals; and
   c. a recombining unit operative to combine said at least two processed signals into a single high-performance output signal.

2. The apparatus of claim 1, wherein said processing unit includes:
   i. a transform unit operative to perform on said input signal a transform from said time domain to a frequency domain to provide a frequency domain input signal,
   ii. a frequency domain information extraction unit operative to perform said extraction through a division of said frequency domain into at least two frequency domain parts, one said part related to a low-resolution signal to noise ratio (SNR) and the other said part related to a high-resolution SNR, and
   iii. a processor operative to process said frequency domain information.

3. The apparatus of claim 2, wherein each of said at least two lower performance converters is an analog-to-digital converter, wherein said input signal is an analog input signal, wherein one of said at least two processed signals is a first processed digital signal jointly processed by a first of said analog-to-digital converters (ADC1) and by said processing unit, and wherein a second of said processed signals is a second processed digital signal jointly processed by a second of said analog-to-digital converters (ADC2) and by said processing unit.

4. The apparatus of claim 3, further comprising;
   d. a subtractor operative to subtract an analog subtraction signal processed by said processor from said analog input signal, said subtractor providing an analog error signal that is further converted by said ADC2 into an ADC2 output signal.

5. The apparatus of claim 4, wherein said transform unit includes a digital transform unit operative to perform said transform and to provide said frequency domain input signal, wherein said frequency domain information extraction unit includes a spectral analysis unit operative to perform said division of said frequency domain into at least an upper frequency domain part and a lower frequency domain part by identifying said upper frequency domain part with a threshold, and wherein said processor includes:
   A. a digital filtering unit operative to perform digital filtering of frequencies below said threshold and to provide a first digitally filtered output,
   B. an inverse transform function operative to inversely transform said first digitally filtered output back into a first filtered time domain digital signal, and
   C. a first digital-to-analog converter (DAC1) operative to convert said first filtered time domain digital signal into said analog subtraction signal.

6. The apparatus of claim 4, further comprising: e. a calibration/equalization unit operative to calibrate the apparatus.

7. The apparatus of claim 6, wherein said calibration/equalization unit is operating in the digital frequency domain.

8. The apparatus of claim 6, wherein said processor further includes a post-DAC filtering unit operative to filter an analog subtraction signal prior to its input to said subtractor, whereby said post-DAC filtering provides a further improvement in the high-performance of the apparatus.

9. The apparatus of claim 6, wherein said transform unit includes a first Fast Fourier Transform (FFT1) function operative to perform said transform and provide said frequency domain input signal, wherein said frequency domain information extraction unit includes a spectral analysis unit operative to perform said division of said frequency domain into at least an upper frequency domain part and a lower frequency domain part by identifying said upper frequency domain part with a threshold, and wherein said processor includes:
   A. a first spectral window filter operative to perform digital filtering of frequencies below said threshold and to provide a first digitally filtered output,
   B. a first inverse Fast Fourier Transform (IFFT1) function operative to inversely transform said first digitally filtered output back into a first filtered time domain digital signal, and
   C. a first digital-to-analog converter (DAC1) operative to convert said first filtered time domain digital signal to provide said analog subtraction signal.

10. The apparatus of claim 9, further comprising:
    e. a second Fast Fourier Transform (FFT2) function operative to perform a transform from the time domain to the frequency domain on said ADC2 output signal to provide an FFT2 output signal;

f. a second spectral window filter operative to perform digital filtering of frequencies above said threshold and to provide a second digitally filtered output
g. a digital summer for recombining said first and second digitally filtered outputs and for providing an FFT sum output, and
h. a second inverse Fast Fourier Transform (IFFT2) function operative to inversely transform said FFT sum output into a second filtered time domain digital signal.

11. The apparatus of claim 10, wherein said recombining unit includes a digital spectral combining unit operative to provide an optional frequency domain digital output and a transform-to-time unit operative to provide a time domain digital output.

12. The apparatus of claim 4, wherein said transform unit includes a digital transform unit operative to perform said transform and to provide said frequency domain input signal, wherein said frequency domain information extraction unit includes a spectral analysis unit operative to perform said division of said frequency domain into at least an upper frequency domain part and a lower frequency domain part by identifying said upper frequency domain part with a threshold, and wherein said processor includes:
A. a digital filtering unit operative to perform digital filtering of frequencies below said threshold and to provide a first digitally filtered output,
B. an inverse transform function operative to inversely transform said first digitally filtered output back into a first filtered time domain digital signal, and
C. a subtraction signal synthesizer operative to synthesize said analog subtraction signal from frequency domain information.

13. A high-resolution, high-speed apparatus for data conversion, comprising:
a. a first, low-resolution analog-to-digital converter (ADC1) operative to output a first digital output signal in a time domain;
b. a first spectral signal processor operative to use a frequency domain to both convert said first digital output signal into an output analog subtraction signal and to provide a processed digital signal;
c. a second low-resolution analog-to-digital converter (ADC2) operative to convert an analog error signal formed in a subtraction operation involving said output analog subtraction signal into a second digital output signal; and
d. a digital combining unit operative to receive said processed digital signal and said second digital output signal and to combine both said signals into a final digital output signal;
whereby the apparatus has a higher resolution that either said ADC1 or said ADC1, and whereby the data conversion is performed in the frequency domain using spectral tools, thereby providing an improved dynamic range and quantization noise, a reduction or elimination of critical analog circuit requirements and bottlenecks, and an increase of the sampling rate relative to existing pipeline/subranging architectures.

14. The apparatus of claim 13, further comprising:
e. a splitter connected to said ADC1 and operative to split an input analog signal into a main channel analog signal used in said subtraction operation and a secondary subtraction channel analog signal input to said ADC1, said main channel analog signal fed to said ADC1.

15. The apparatus of claim 14, further comprising:
f. a subtractor operative to perform said subtraction operation; and
g. a delay inserted in a path between said splitter and said subtractor and operative to compensate for delays occurring in said subtraction channel.

16. The apparatus of claim 15, further comprising:
h. an amplitude scaling unit coupled to said ADC2 and operative to adapt said analog error signal to a range of said ADC2;
i. a separate optional digital combining unit operative to combine said first and second digital output signals of respectively said ADC1 and ADC2 and to output an optional digital signal; and
j. at least one optional second spectral signal processor coupled to said ADC2 and to said digital combining unit and operative to provide at least one additional subtraction stage.

17. The apparatus of claim 14, further comprising:
f. a calibration/equalization unit operative to calibrate the apparatus.

18. The apparatus of claim 17, further comprising:
g. a signal conditioner operative to condition said secondary subtraction channel analog signal before its input to said ADC2; and
h. a transform function operative to receive said second digital output signal from said ADC2 and to transform said second digital output signal from said time domain to said frequency domain, thereby obtaining a second transformed digital signal in the frequency domain.

19. The apparatus of claim 13, wherein said digital combining unit includes a digital spectral combining unit operative to provide an optional frequency domain digital output, and a transform-to-time unit operative to provide a time domain digital output.

20. The apparatus of claim 13, wherein said first spectral signal processor includes:
i. a transform function operative to transform said first digital output signal from said time domain to said frequency domain, thereby providing a first transformed digital signal,
ii. a spectral analysis unit operative to perform spectral analysis in said frequency domain using said first transformed digital signal and to provide output frequency information that includes a dynamic frequency range divided into abovethreshold frequencies and below-threshold frequencies,
iii. a digital filtering unit operative to strongly attenuate said below threshold frequencies and to transfer without attenuation said above-threshold frequencies to provide a digitally filtered output,
iv. an inverse transform function operative to inversely transform said digitally filtered output into an inversely transformed output, and
v. a first digital-to-analog converter (DAC1) operative to receive and convert said output frequency information and said inversely transformed output into said output analog subtraction signal.

21. The apparatus of claim 20, wherein said first spectral signal processor further includes a post-DAC analog filtering unit coupled to said subtractor and operative to filter said output analog subtraction signal prior to its input to said subtractor.

22. The apparatus of claim 20, wherein said transform function is performed by a Fast Fourier Transform (FFT) and wherein said inverse transform function is performed by an Inverse Fast Fourier Transform (IFFT).

23. The apparatus of claim 20, wherein said transform function is performed by a filter bank.

24. The apparatus of claim 13, wherein said first spectral signal processor includes:
   i. a transform function operative to transform said first digital output signal from said time domain to said frequency domain, thereby providing a first transformed digital signal,
   ii. a spectral analysis unit operative to perform spectral analysis in said frequency domain using said first transformed digital signal and to provide output frequency information that includes a dynamic frequency range divided into above-threshold frequencies and below-threshold frequencies, each said above-threshold frequencies and below-threshold frequencies including respective spectral peaks,
   iii. a digital filter operative to filter an output signal received from said ADC1 and to output a filtered signal with strongly attenuated below-threshold frequencies,
   iv. a first digital-to-analog converter (DAC1) operative to convert said output filtered signal into said output analog subtraction signal, and
   v. a post DAC filter operative to attenuate said below-threshold frequencies, thereby providing additional improvement of quantization noise and errors of said DAC1.

25. The apparatus of claim 13, wherein said first spectral signal processor includes:
   i. a transform function operative to transform said first digital output signal from said time domain to said frequency domain, thereby providing a first transformed digital signal,
   ii. a spectral analysis unit operative to perform spectral analysis in said frequency domain using said first transformed digital signal and to provide output frequency information that includes a dynamic frequency range divided into above-threshold frequencies and below-threshold frequencies,
   iii. a digital filtering unit operative to strongly attenuate said below-threshold frequencies and to transfer without attenuation said above-threshold frequencies to provide a digitally filtered output,
   iv. a plurality of inverse transform functions operative to inversely transform said digitally filtered output into separate respective inversely transformed outputs; and
   v. a subtraction signal synthesizer that synthesizes above-threshold frequency signals from said respective inversely transformed outputs.

26. A method for implementing a high-performance converter comprising the steps of:
   a. providing a conversion unit operative to convert an input signal obtained in a time domain, said conversion unit including at least two lower-performance converters, each said converter having at least one lower performance parameter than the high-performance converter;
   b. providing a processing unit coupled to said conversion unit and operative to process digital frequency domain information extracted from said input signal, and, based on said processed frequency domain information, operative to provide in combination with said conversion unit at least two processed signals; and
   c. providing a recombining unit operative to combine said at least two processed signals into a single high-performance output signal.

27. The method of claim 26, wherein said input signal is a time domain input signal, wherein said processing of frequency domain information includes:
   i. processing a frequency domain signal from said time domain input signal using said at least two lower performance converters by:
      A. transforming said time domain input signal into said frequency domain signal in a digital form,
      B. dividing said frequency domain into at least two frequency domain parts, a first said part related to a low-resolution signal to noise ratio (SNR) and a second said part related to a high-resolution SNR, thereby extracting said frequency domain information from said frequency domain signal in a digital form, and
      C. using said frequency domain information to obtain said at least two processed signals;
   and wherein said combining of at least two processed signals into a single high-performance output signal includes recombining said at least two processed signals to obtain a first final output signal from the high-performance converter.

28. The method of claim 27, wherein said dividing of said frequency domain into at least two frequency domain parts includes providing a threshold above said low-resolution SNR part that determines said division, thereby providing above-threshold frequencies in a window W1 and below-threshold frequencies in a window W2, wherein said W1 and W2 are correlated respectively with said first and seconds frequency domain parts.

29. The method of claim 28, wherein said time domain input signal is an analog signal, wherein said high-performance converter is a high-performance analog-to-digital converter (ADC), wherein a first of said at least two lower performance converters is a first high-speed, low-resolution analog-to-digital converter (ADC1), and wherein said transforming further includes
   i. using said ADC1 to convert a subtraction channel representation of said time domain analog input signal into a first time domain digital output signal which is fed to a first spectral processor.

30. The method of claim 29, wherein a second of said at least two lower performance converters is a second analog-to-digital converter (ADC2), wherein said transforming is preceded by splitting said analog input signal into a main channel signal representation and into said subtraction channel signal representation, both said signals representing said analog input signal, and wherein said processing of frequency domain information further includes:
   ii using said first spectral processor to process said first time domain digital output signal and to obtain above-threshold frequency information in a digital form; and
   iii. generating, by said first spectral processor and using said above-threshold frequency domain part, a first digitally filtered output signal and an analog subtraction signal, said analog subtraction signal subtracted in a subsequent subtraction operation from said main channel signal, said subtraction operation providing an analog error signal.

31. The method of claim 30, wherein said processing of frequency domain information further includes:
   iv. processing said analog error signal formed in said subtraction operation,
   v. converting said error signal into a second digital output signal using said ADC2,
and wherein said recombining said at least two processed signals to obtain a first final output signal from the high-performance converter includes digitally combining said first digitally filtered output signal and said second digital output signal into a first final digital output signal, using a first digital combining unit.

32. The method of claim 31, further comprising the step of coupling a second spectral processor to said ADC2 and said first digital combining unit to provide at least one additional subtraction stage.

33. The method of claim 31, further comprising the step of combining said first digital output signal from said ADC1 and said second digital output signal from said ADC2 in a second digital combining unit to optionally provide a second final digital output in a time domain.

34. The method of claim 31, wherein said dividing of said frequency domain into at least two frequency domain parts is performed using a spectral analysis unit included in said first spectral processor, wherein said generating of a digitally filtered output signal is performed by a digital filtering unit coupled to said spectral analysis unit and wherein said generating of an analog subtraction signal is performed by a digital-to-analog converter coupled to said digital filtering unit through an inverse transform function.

35. The method of claim 30, wherein said at least two converters are Analog-to-Digital Converters (ADCs) in a subranging/pipeline arrangement, wherein said processing of frequency domain information further includes:
   i. converting said analog error signal into a second digital output signal using said ADC2,
   ii. transforming said second digital output signal into a second frequency domain signal,
   iii. digitally filtering said second digital frequency domain signal by W1 to obtain a second digitally filtered output signal, and
   iv. equalizing said second frequency domain signal and subtracting the result of said equalization from said first digitally filtered output signal in said W1 frequency range to obtain an improved resolution first digitally filtered output signal;

and wherein said recombining said at least two processed signals to obtain a first final output signal further includes summing vectorially said improved resolution first digitally filtered output signal and said second digitally filtered output signal to provide a frequency domain digital output signal, thereby obtaining better resolution within a FFT bin.

36. The method of claim 28, wherein said recombining said at least two processed signals to obtain a final output signal from the high-performance converter includes obtaining a first final digital output signal in a domain selected from the group consisting of a time domain and a frequency domain.

37. The method of claim 28, wherein said time domain input signal is a digital signal, wherein said high-performance converter is a high-performance digital-to-analog converter (DAC) having both high-resolution and high-speed, wherein a first of said at least two lower performance converters is a DAC with the same high-speed but lower resolution than said high-performance DAC while all the rest of said at least two lower performance DAC are lower-speed, high-resolution DACs, and wherein said transforming includes directly transforming said input signal from said time domain into said frequency domain.

38. The method of claim 37, wherein recombining said at least two processed signals to obtain a final output signal from the high-performance converter includes parallel frequency interleaving of said at least two processed analog signals.

39. A method for implementing a high-performance data converter comprising the steps of:

a. processing a time domain input signal into a frequency domain signal in a digital form using at least two data converters having each at least one lower performance parameter than the high-performance converter in order to obtain at least two processed signals; and b. recombining said at least two processed signals to obtain a final output signal from the high-performance converter.

40. The method of claim 39 wherein said step of processing a time domain input signal into a frequency domain signal in a digital form using at least two data converters includes using at least two analog-to-digital Converters (ADCs) in a filter bank ADC arrangement, each said ADC converter having high resolution, whereby the method provides increased sampling rate by combining at least two ADCs in parallel in the digital frequency domain and by use of digital processing in the frequency domain.

41. The method of claim 39 wherein said step of processing a time domain input signal into a frequency domain signal in a digital form using at least two data converters includes using at least two digital-to-analog Converters (DACs) in a filter bank DAC arrangement, each said DAC converter having high resolution, whereby the method provides increased sampling rate by combining at least two DACs in parallel in the digital frequency domain, by use of the digital processing in the frequency domain.

42. The method of claim 39, wherein said at least two converters are analog-to-digital converters (ADCs) in a subranging/pipeline arrangement, wherein said step of processing includes:
   i. splitting an input analog signal into two signals, one analog signal input to a first ADC (ADC 1) to provide a first time domain digital output signal, and the other analog signal input into a subtractor,
   ii. transforming said first ADC1 time domain output signal into a first frequency domain signal,
   iii. equalizing said first frequency domain signal to obtain a first equalized frequency domain signal,
   iv. inverse transforming said first equalized frequency domain signal into a time domain digital signal,
   v. creating an analog subtraction signal from said time domain digital signal using a digital to analog converter,
   vi. obtaining an error signal by subtracting said analog subtraction signal from said analog signal input into the subtractor, vii. converting said error signal into a second time domain digital output signal using a second ADC (ADC2),
   viii. transforming said second time domain digital output signal into a second frequency domain signal, and
   ix. equalizing said second frequency domain signal to obtain a second equalized frequency domain signal and subtracting said second equalized frequency domain signal from said first frequency domain signal, and wherein said step of recombining includes
   x. summing vectorially said first equalized time domain signal and said second equalized frequency domain signal to provide a frequency domain digital output signal, and
   xi. transforming said frequency domain digital output signal into a time domain signal using an inverse transform to obtain said final output signal.

* * * * *

UNITED STATES PATENT AND TRADEMARK OFFICE
CERTIFICATE OF CORRECTION

PATENT NO. : 7,289,053 B2 Page 1 of 1
APPLICATION NO. : 10/552033
DATED : October 30, 2007
INVENTOR(S) : Bunin It is certified that error appears in the above-identified patent and that said Letters Patent is hereby corrected as shown below:

Title Page, Item (21)

The filing date (3 October 2005) of Application No. 10/552,033 should be inserted.

Signed and Sealed this

Fourth Day of March, 2008

JON W. DUDAS
*Director of the United States Patent and Trademark Office*